United States Patent [19]
Churchill et al.

[11] Patent Number: 5,953,285
[45] Date of Patent: Sep. 14, 1999

[54] SCAN PATH CIRCUITRY INCLUDING AN OUTPUT REGISTER HAVING A FLOW THROUGH MODE

[75] Inventors: Jonathan F. Churchill, Reading; Neil P. Raftery, Guildford, both of United Kingdom; Jeyakumar Shanmugam, San Jose, Calif.; Mark A. Finn, Mountain View, Calif.; Thomas M. Surrette, Saratoga, Calif.; Cathal G. Phelan, Mountain View, Calif.; Ashish Pancholy, Milipitas, Calif.

[73] Assignee: Cypress Semiconductor Corp., San Jose, Calif.

[21] Appl. No.: 08/932,638

[22] Filed: Sep. 17, 1997

[51] Int. Cl.[6] ....................................... G11C 8/00
[52] U.S. Cl. .................. 365/233; 365/189.04; 375/355
[58] Field of Search ............................ 365/233, 189.05; 375/355; 395/551; 371/22.36; 307/272.2

[56] References Cited

U.S. PATENT DOCUMENTS

| | | | |
|---|---|---|---|
| 4,272,832 | 6/1981 | Ito | 365/189 |
| 4,286,174 | 8/1981 | Dingwall | 307/242 |
| 4,355,377 | 10/1982 | Sud et al. | 365/203 |
| 4,767,947 | 8/1988 | Shah | 307/265 |
| 4,797,585 | 1/1989 | Segawa et al. | 307/594 |
| 4,843,255 | 6/1989 | Stuebing | 307/273 |
| 4,894,791 | 1/1990 | Jiang et al. | 364/570 |
| 4,951,254 | 8/1990 | Ontrop et al. | 365/201 |
| 4,985,643 | 1/1991 | Proebsting | 307/443 |
| 4,995,039 | 2/1991 | Sakashita | 371/22.3 |
| 5,003,513 | 3/1991 | Porter et al. | 365/230.08 |
| 5,039,875 | 8/1991 | Chang | 307/272.3 |
| 5,130,568 | 7/1992 | Miller et al. | 307/272.2 |
| 5,151,614 | 9/1992 | Yamazaki et al. | 307/272.3 |
| 5,157,781 | 10/1992 | Harwood et al. | 395/575 |
| 5,163,168 | 11/1992 | Hirano et al. | 307/365 |

(List continued on next page.)

FOREIGN PATENT DOCUMENTS

| | | |
|---|---|---|
| 60-85498 | 5/1985 | Japan . |
| 62-261215 | 11/1987 | Japan . |
| 4129416 | 4/1992 | Japan . |
| 5206797 | 8/1993 | Japan . |

OTHER PUBLICATIONS

Wendell et al., "A 3.5ns, 2Kx9 Self Timed SRAM", 1990 IEEE, 1990 Symposium on VLSI Circuits, pp. 49–50.

Bonges, III et al., "A 576K 3.5–ns Access BiCMOS ECL Static RAM with Array Built–in Self Test", 1992 IEEE, pp. 649–656.

Chappell et al., A 2–ns Cycle, 3.8–ns Access 512–kb CMOS ECL SRAM with a Fully Pipelined Architecture, Nov. 1991, IEEE Journal of Solid–State Circuits, vol. 26, No. 11, pp. 1577–1585.

Childs et al., "An 18–ns 4Kx4 CMOS SRAM", Oct. 1984, IEEE Journal of Solid–State Circuits, vol. SC–19, No. 5, pp. 545–551.

Flannagan et al., "Two 13–ns 64K CMOS SRAM's with Very Low Active Power and Improved Asynchronous Circuit Techniques", Oct., 1986, IEEE Journal of Solid–State Circuits, vol. SC–21. No. 5, pp. 692–703.

Kobayashi et al., "A 10–$\mu$W Standby Power 256K CMOS SRAM", Oct. 1985, IEEE Journal of Solid–State Circuits, vol. SC–20, No. 5, pp. 935–939.

(List continued on next page.)

*Primary Examiner*—David Nelms
*Assistant Examiner*—David Lam
*Attorney, Agent, or Firm*—Blakely Sokoloff Taylor & Zafman LLP

[57] ABSTRACT

A circuit including a register coupled to a control circuit. The register has a synchronous mode of operation and an asynchronous mode of operation. The a control circuit controls whether the register operates in the synchronous mode or the asynchronous mode. The circuit may further include a scan register having scan data. The control circuit may cause the register to operate in the synchronous or asynchronous mode in response to the scan data.

22 Claims, 15 Drawing Sheets

U.S. PATENT DOCUMENTS

| | | | |
|---|---|---|---|
| 5,172,012 | 12/1992 | Ueda | 307/272.3 |
| 5,177,375 | 1/1993 | Ogawa et al. | 307/272.3 |
| 5,218,237 | 6/1993 | Mao | 307/265 |
| 5,306,958 | 4/1994 | Reddy et al. | 307/265 |
| 5,321,317 | 6/1994 | Pascucci et al. | 307/296.4 |
| 5,325,367 | 6/1994 | Dekker et al. | 371/21.1 |
| 5,343,082 | 8/1994 | Han et al. | 307/234 |
| 5,384,737 | 1/1995 | Childs et al. | 365/189.05 |
| 5,396,110 | 3/1995 | Houston | 327/172 |
| 5,406,566 | 4/1995 | Obara | 371/21.2 |
| 5,420,467 | 5/1995 | Huott et al. | 327/174 |
| 5,428,311 | 6/1995 | McClure | 327/276 |
| 5,438,550 | 8/1995 | Kim | 365/233.5 |
| 5,485,466 | 1/1996 | Lyon et al. | 371/22.3 |
| 5,568,437 | 10/1996 | Jamal | 365/201 |
| 5,590,089 | 12/1996 | Roohparvar | 365/233.5 |
| 5,631,911 | 5/1997 | Whetsel, Jr. | 371/22.3 |
| 5,654,988 | 8/1997 | Hayward et al. | 375/355 |
| 5,701,308 | 12/1997 | Attaway et al. | 371/22.3 |
| 5,712,584 | 1/1998 | McClure | 327/198 |
| 5,734,660 | 3/1998 | Fujisaki | 371/22.3 |
| 5,774,474 | 6/1998 | Narayanan et al. | 371/22.31 |
| 5,781,718 | 7/1998 | Nguyen | 395/183.09 |
| 5,787,096 | 7/1998 | Roberts et al. | 371/21.1 |

OTHER PUBLICATIONS

Williams et al., An Experimental 1–Mbit CMOS SRAM with Configurable Organization and Operation, Oct. 1988, IEEE Journal of Solid–State Circuits, vol. 23, No. 5, pp. 1085–1093.

Stan Runyon, "EDA Software Syntest Stresses Speed Fault simulator blasts million–gate designs".

David DiMarco, et al., "FA 9.8: A 200 MHz 256kB Second–Level Cache with 1.6GB/s Data Bandwidth" 1996 IEEE International Solid–State Circuits Conference, ISSCC96/Session 9/SRAM/Paper FA 9.8, Feb. 9, 1996.

Manuel J. Raposa, Dual Port Static Ram Testing, Paper 20.3, 1988 International Test Conference, pp. 362–368.

Junji Nishimura, Advantest Corporation, "New Testing Devices Are Responding to Higher Performance in Megabit Age", Hi–Tech Report: Memroy Testing Technology, Jan. 1989, pp. 96–101.

Andre Ivanov, Department of Electrical Engineering, University of British Columbia, "Design for Testability and Built–In Self–test of Integrated Circuits and Systems: How These Can Add Value to Your Products", 1996, pp. 712–717.

M. Nicolaidis, et al., "Trade–offs in Scan Path and BIST Implementations for RAMs", Journal of Electronic Testing: Theory and Applications, pp. 5, 273–283, 1994.

Ad J. Van De Goor, et al., "Effective March Algorithms for Testing Single–Order Addressed Memories", Journal of Electronics Testing: Theory and Applications, 5, 337–345, 1994.

D. Roy Chowdhury, et al., "Cellular automata based pattern generator for testing RAM", IEE Proceedings –E. vol. 139. No. 6. Nov. 1992, pp. 469–476.

Kewal K. Saluja, et al., "Test Pattern Generation for API Faults in RAM", IEEE Transactions on Computers, vol. C–34, No. 3, Mar. 1985, pp. 284–287.

G. M. Ettinger, et al., "Memory–based logic sequence generation", Microprocessors and Microsystems, vol. 9, No. 9, Nov. 1985, pp. 446–451.

L. Lucas, et al., "Design Methodology of a Test Chip for a Portable 8ns 10 Ports Register File", IEEE 1995 Custom Integrated Circuits Conference, 1995, pp. 29–32.

Manoj Franklin, et al., "Embedded RAM Testing", IEEE, 1995, pp. 29–33.

Zuxi Sun, "Self–Testing of Embedded RAMs", 1984 International Test Conference, Paper 4.3, pp. 148–156.

| b1 | SACLK CONTROL | |
|---|---|---|
| b2 | | |
| b3 | | |
| b4 | FLOW THROUGH RIGHT | |
| b5 | WORD LINE STRESS | |
| b6 | CCPULSE PULSE WIDTH | |
| b7 | | |
| b8 | FLOW THROUGH LEFT | |

Fig. 4

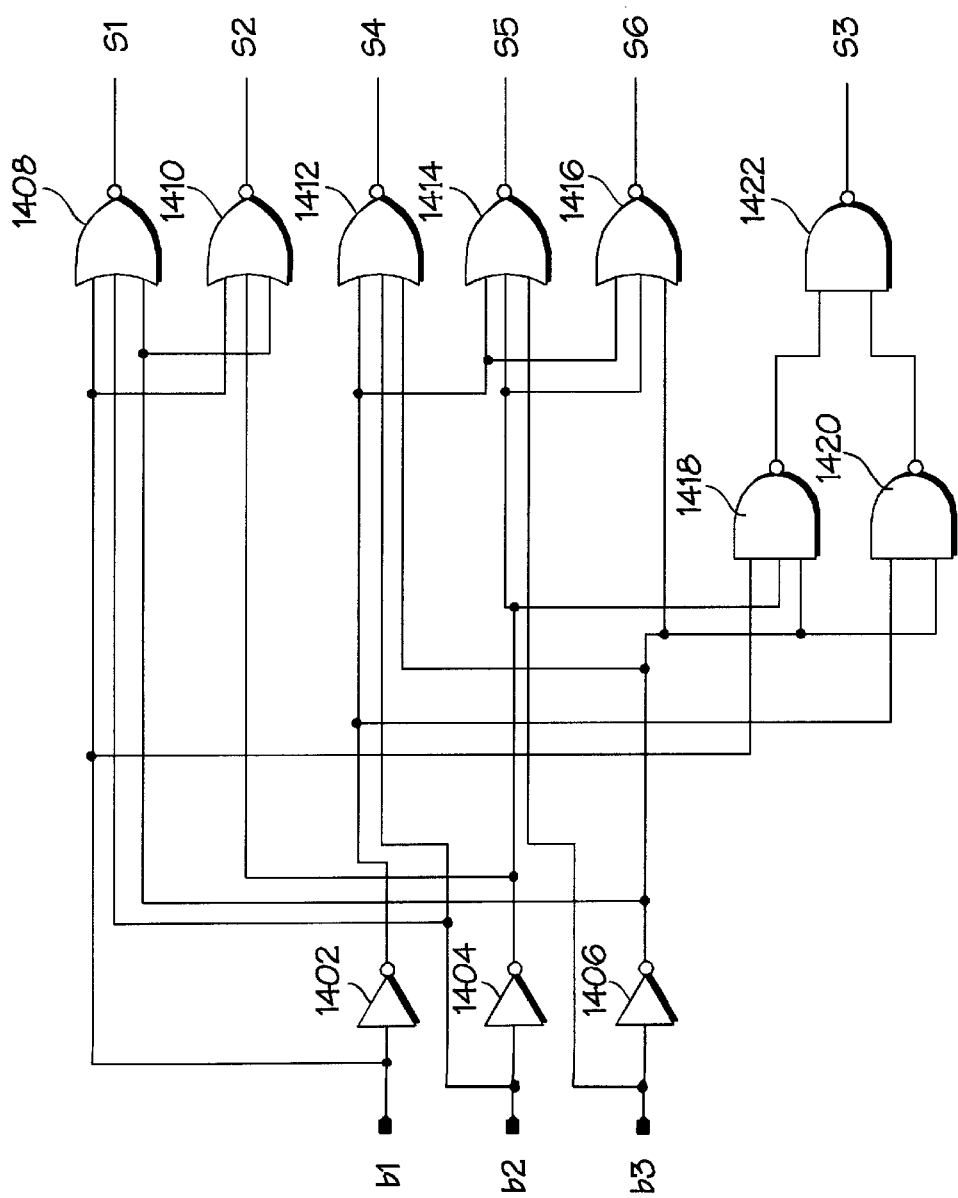

SCAN PATH CIRCUITRY INCLUDING AN OUTPUT REGISTER HAVING A FLOW THROUGH MODE

CROSS-REFERENCE TO RELATED APPLICATIONS

This application may be related to copending U.S. patent application Ser. No. 08/932,657 entitled "TEST MODE FEATURES FOR SYNCHRONOUS AND PIPELINED MEMORIES", U.S. patent application Ser. No. 08/932,315 entitled "SCAN PATH CIRCUITRY INCLUDING A PROGRAMMABLE DELAY CIRCUIT", and U.S. patent application Ser. No. 08/931,989 entitled "SCAN PATH CIRCUITRY FOR PROGRAMMING A VARIABLE CLOCK PULSE WIDTH".

BACKGROUND OF THE INVENTION

1. Field of the Invention

The present invention relates to test mode features for integrated circuits. More particularly, the present invention relates scan path test mode features for synchronous and pipelined memories.

2. Background

It has become increasingly important to build test circuitry into integrated circuits. Scan path and Built-In Self-Test (BIST) techniques have been developed to verify the proper logic function of integrated circuits, and are valuable tools for testing the logical operation of circuits within an integrated circuit. These techniques have also been used to test or monitor the state of circuit nodes that may be otherwise inaccessible from external pins of the integrated device.

Some logic failures may be due to internal timing problems or skews within a device. If these timings can be altered, a previously inoperative part may be fixed or altered to function correctly. Additionally, the function of particular circuits or the entire integrated circuit may be characterized in response to adjusting timing parameters within the device. It also may be advantageous to adjust internal timing parameters to increase the speed of a particular circuit or the overall response of the integrated circuit. Current scan path and BIST techniques, however, are not conventionally used to programmably alter the internal timing of circuits. Therefore, what is needed is a means for altering the internal timing of signals of circuits to more accurately determine the cause of failures within the device, to improve characterization of circuit or device responses, or to increase (or decrease) the response of a device.

Scan path and BIST techniques have also been used in memory devices such as asynchronous static random access memory (SRAM) devices to test the integrity of the memory core. Synchronous SRAMs, and especially synchronous pipelined SRAMs, present particularly difficult problems of test observability and characterization. FIG. 1 shows a conventional synchronous pipelined SRAM 100 having an asynchronous memory core 104, clocked input register 102, and clocked output register 104. Data or address information is clocked into input register 102, and is subsequently provided to memory core 104. Similarly, data output from memory core 104 is clocked into and out of register 106.

When testing memory core 104, only the output of output register 106 can be monitored. Output register 106 prevents the observation of (or "masks") internal memory signal transients from memory core 104. If memory core 104 is malfunctioning, then it is possible that output register 106 could mask this error by erroneously outputting expected data. Therefore, it may be difficult to determine whether output register 106 or memory core 104 is defective.

Therefore, what is needed is a means for disabling the clocked output register in a synchronous SRAM device to increase the test observability of the memory core, to directly monitor signals output by memory core 104, and/or to increase the likelihood of determining whether failures are being caused by defective memory locations or by the clocked output register.

Synchronous or pipelined memories often use clock signals for timing certain functions associated with the memory core. Incorrectly designed, manufactured, or margined time settings in these clock signals may cause failures to be observed at output register 106 even though the memory core itself is functioning properly. For example, if a sense amplifier circuit is prematurely enabled to read out data from the memory core, output register 106 may clock out incorrect data.

Therefore, what is needed is a means to disable output register 106 to monitor directly the effects of internal clock signals on the memory core. What is also needed is a means to alter the timing of internal clock signals to determine whether any failures are the result of improper signal timing or a defective memory core.

SUMMARY OF THE INVENTION

In one embodiment, the present invention concerns a circuit including a register coupled to a control circuit. The register has a synchronous mode of operation and an asynchronous mode of operation. The a control circuit controls whether the register operates in the synchronous mode or the asynchronous mode. The circuit may further include a scan register having scan data. The control circuit may cause the register to operate in the synchronous or asynchronous mode in response to the scan data.

Other features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which:

FIG. 4 shows one embodiment of a scan register bit definition for the scan register of FIG. 3;

FIG. 14 shows a circuit diagram of one embodiment of decode logic 504 of FIG. 5.

DETAILED DESCRIPTION

Scan path circuitry including test modes for a synchronous pipelined memory is disclosed. The scan path circuitry includes a programmable scan test interface that has test mode pins and a protocol for using these test mode pins to control whether an integrated circuit loads or outputs scan test data, enters a test mode defined by the scan test data, or operates in a normal fashion (e.g., is configured to conventionally read data from and/or write data to the memory core).

The scan path circuitry supports a number of test modes that may improve the test observability and characterization of an integrated device. These test modes may be advantageous for testing a synchronous integrated circuit including clocked input or output registers. For example, these test modes may be particularly advantageous for testing a synchronous pipelined SRAM device.

For one embodiment, the programmable scan test interface includes a scan register. Scan data may be loaded into the scan register to enable a test mode that selectively disables a clocked output register. With the clocked output register disabled, data from the memory core of a SRAM device, for example, may flow through the output register and be directly monitored. This improves the direct observability of the memory core operation and may improve the ability to test the memory core without any undesirable output register masking effects.

For another embodiment, scan data may be loaded into a scan register to enable a test mode that adjusts the timing of signals internal to the device under test. For example, in response to the scan data, a programmable delay circuit may be programmed to selectively provide one or more different delay paths for a given internal signal. The response of the device under test may then be monitored in response to the altered timing set. In this manner, the device under test may be characterized for timing margins. Alternatively, analyses may be performed to determine whether memory core integrity is corrupted or supporting clocked circuits (e.g., clocked sense amplifiers) are causing observed failures. For another embodiment, signal pulse widths may also be varied or adjusted for characterization or failure analysis purposes.

For yet another embodiment, scan data may be loaded into a scan register to enable a test mode that causes internal signals of the device under test to be replaced with external signals. For example, this test mode may enable the replacement of an internally generated clock pulse signal with an external clock signal. This may be advantageous when, for example, the internally generated clock signal is coupled to a memory word line. Activating the word line with an external clock (pulse) signal having a pulse width longer than the internal clock signal provides a means for stressing the memory cells in a memory core.

Figure 1:
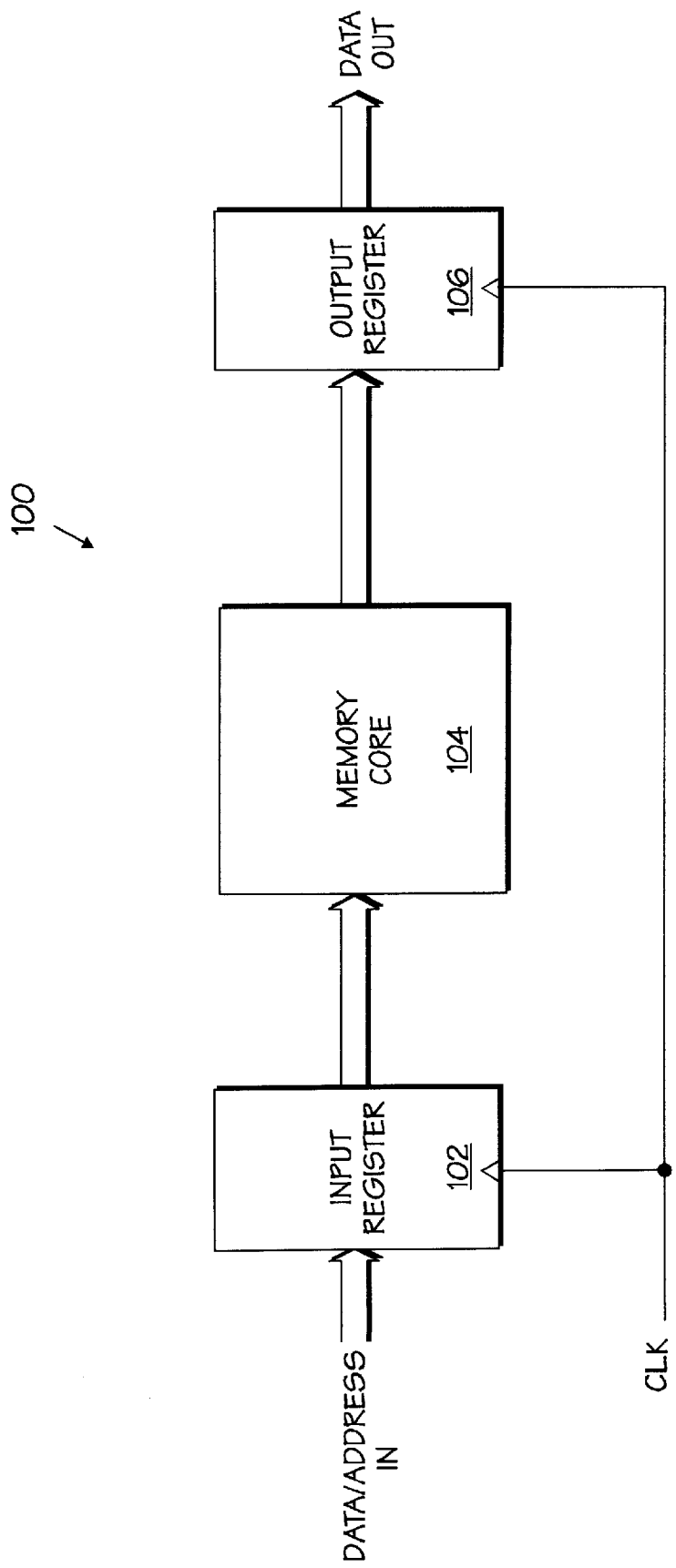
FIG. 1 shows a synchronous pipelined static random access memory (SRAM) device according to the prior art.
Figure 2:
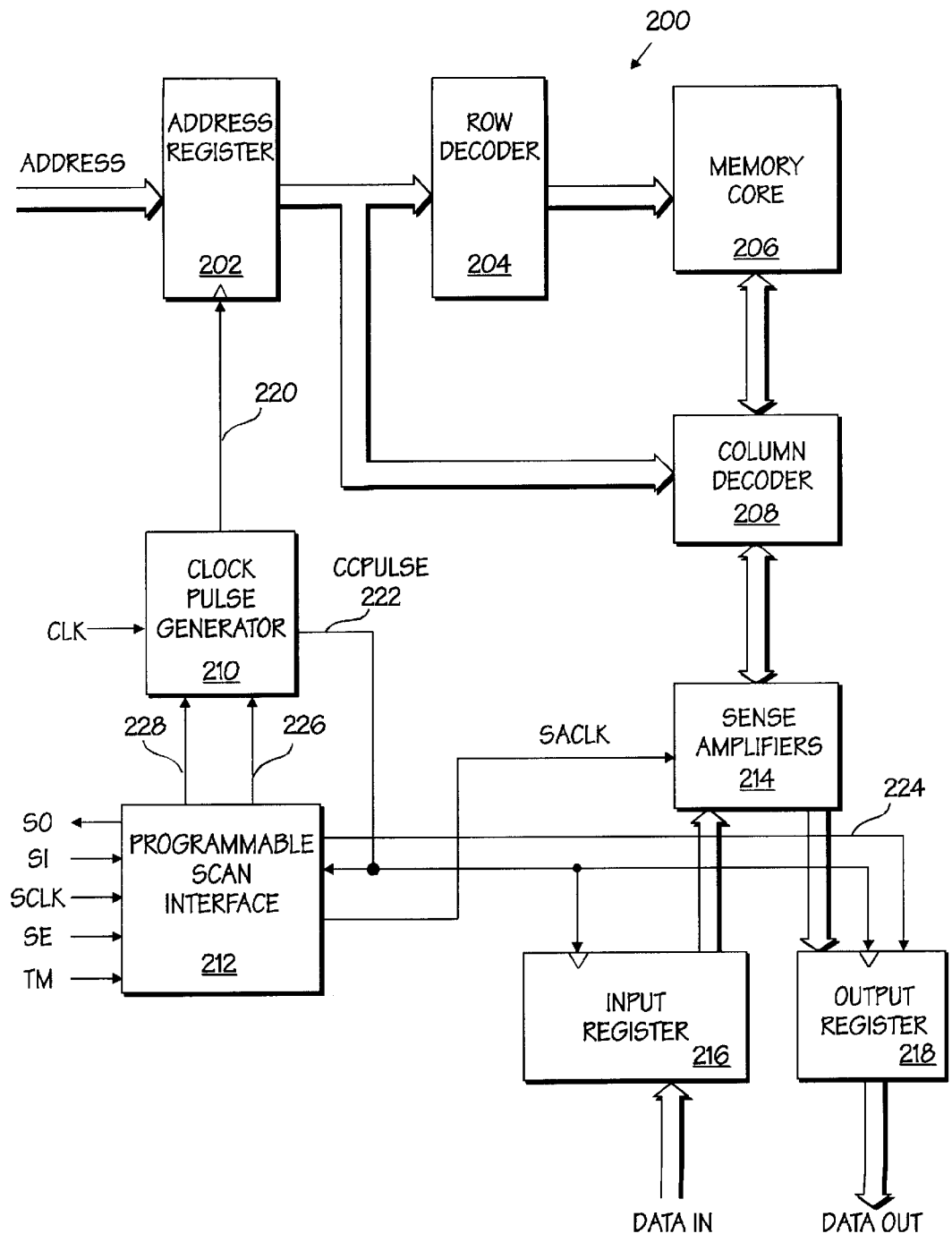
FIG. 2 shows a block diagram of an exemplary synchronous pipelined SRAM device including a programmable scan interface according to the present invention.

FIG. 2 shows one embodiment of a synchronous pipelined SRAM device 200 in which the present invention may be incorporated. This embodiment is not intended to limit the scope of the application of the present invention, as it may also be incorporated in other integrated circuit devices such as synchronous pipelined (e.g., register containing) dynamic random access memories (DRAMs), first-in-first-out (FIFO) memories, content addressable memories (CAMs), programmable logic devices (PLDs), and the like. The present invention may also be incorporated in system level circuits.

SRAM 200 includes memory core 206, which may actually be any type of volatile (e.g., preferably SRAM) or nonvolatile memory arranged as one or more blocks or arrays of memory cells, organized in rows and columns. One or more memory cells in memory core 206 may be addressed by decoding an address clocked into address register 202 by a clock signal generated on line 220 by clock pulse generator 210. The address bits stored in address register 202 may be decoded by row decoder 204 and column decoder 208. Row decoder 204 selects a row of memory cells in memory core 206 by enabling a corresponding word line. Column decoder 208 selects one or more columns (e.g., bit line(s)) in memory core 206 and enables data to be written to or read from memory core 206 in response to a write enable or read enable signal, respectively.

Data may be written to memory core 206 by first writing input data into input register 216 in response to a first internal clock signal (e.g., CCPULSE) generated by clock pulse generator 210 on line 222. Data bits stored in input register 216 may be coupled to column decoder 208 via sense amplifiers 214 and written into a selected memory cell. Data may be read or sensed from memory core 206 by sense amplifiers 214. A second internal clock signal (e.g., SACLK) may be generated by programmable scan interface 212 to enable the sense amplifiers 214 to sense the data output by memory core 206 via column decoder 208. The sensed data output by sense amplifiers 214 may then be written into output register 218. This data may be clocked out of output register 218 in response to the first internal clock signal on line 222. There may be one or more output registers 218 in SRAM 200.

Programmable scan interface 212 provides a mechanism for programmably altering various signals within SRAM 200 to improve the observability and characterization of circuitry within SRAM 200. For example, programmable scan interface 212 may output from one to n control signal(s) on line(s) 224. Control line(s) 224 may comprise from one to n lines (or from one to n/m lines, where m is the value of an m-to-1 multiplexer coupling the control signals from programmable scan interface 212 to control line(s) 224) or busses. One of the control signals may configure output register 218 to become transparent; that is, output register 218 may switch from synchronous to asynchronous operation, such that data may be passed directly through output register 218. This may increase the ability to monitor and test the operation of the memory core without interference and/or masking effects caused by output register 218. One or more of the control signals may also be coupled to input register 216 to configure input register 216 to become transparent.

Additionally, the timing of internal signals and internal signal pulse widths may be controlled by programmable scan interface 212. For example, the pulse width of the first and/or second internal clock signal(s) (e.g., affecting the timing of CCPULSE and/or SACLK) may be adjusted by programmable scan interface 212 so as to characterize the functionality and timing margins of the sense read and/or write circuitry, address circuitry and/or amplifiers. The timing of the internal clock signals may also be programmably altered by programmable scan interface 212 to determine if memory core 206 is defective, or if the timing of CCPULSE or SACLK is causing a failure observed at the output of output register 218.

Programmable scan interface 212 may also programmably alter the clock pulse width of CCPULSE on line 222. Programmable scan interface 212 may accomplish this by outputting one or more control signals on line 226, which may comprise one or more control lines as described above for control line(s) 224. Additionally, programmable scan interface 212 may replace CCPULSE on line 222 with an external periodic signal (e.g., a timing signal or the CLK signal) having a characteristic frequency (preferably lower than the corresponding frequency of one of the internal clock signals) by activating one or more control signals on line 228. Line 228 may comprise one or more control lines as for control lines 244 and/or 226.

Programmable scan interface 212 may be programmed to alter the various signals or functions of SRAM 200 in response to a number of input signals (wherein the number of input signals is ≧2, preferably ≧3, and more preferably ≧4) that may be supplied from external pins on SRAM 200. These pins may be dedicated pins, no-connect (NC) pins with hidden functions, pins that multiplex the scan path test mode functions with other functions for SRAM 200, etc. These signals may include a serial input data signal SI, a serial timing signal (e.g., SCLK), a scan mode activation enable signal (e.g., SE), and a test mode activation enable signal (e.g., TM).

Programmable scan interface 212 implements a protocol that responds to one or more of its input signals (e.g., SCLK, SE and TM) to configure SRAM 200 to conventionally write and read data to and from memory core 206 (a so-called "normal" or "default" mode of operation), to scan bits or test words into or out from programmable interface 212, or to enable a particular test mode to be executed in response to the scan bits in programmable scan interface 212. Table 1 summarizes some exemplary operations of programmable scan interface 212 and SRAM 200 in response to the states of the test mode and scan enable signals.

TABLE 1

| STATE | TM | SE | OPERATION |
|---|---|---|---|
| 1 | 0 | 0 | Default Memory Operation |
| 2 | 0 | 1 | Scan-In/Scan-Out Test Word |
| 3 | 1 | 0 | Test Mode |
| 4 | 1 | 1 | Currently Unused State |

Figure 3:
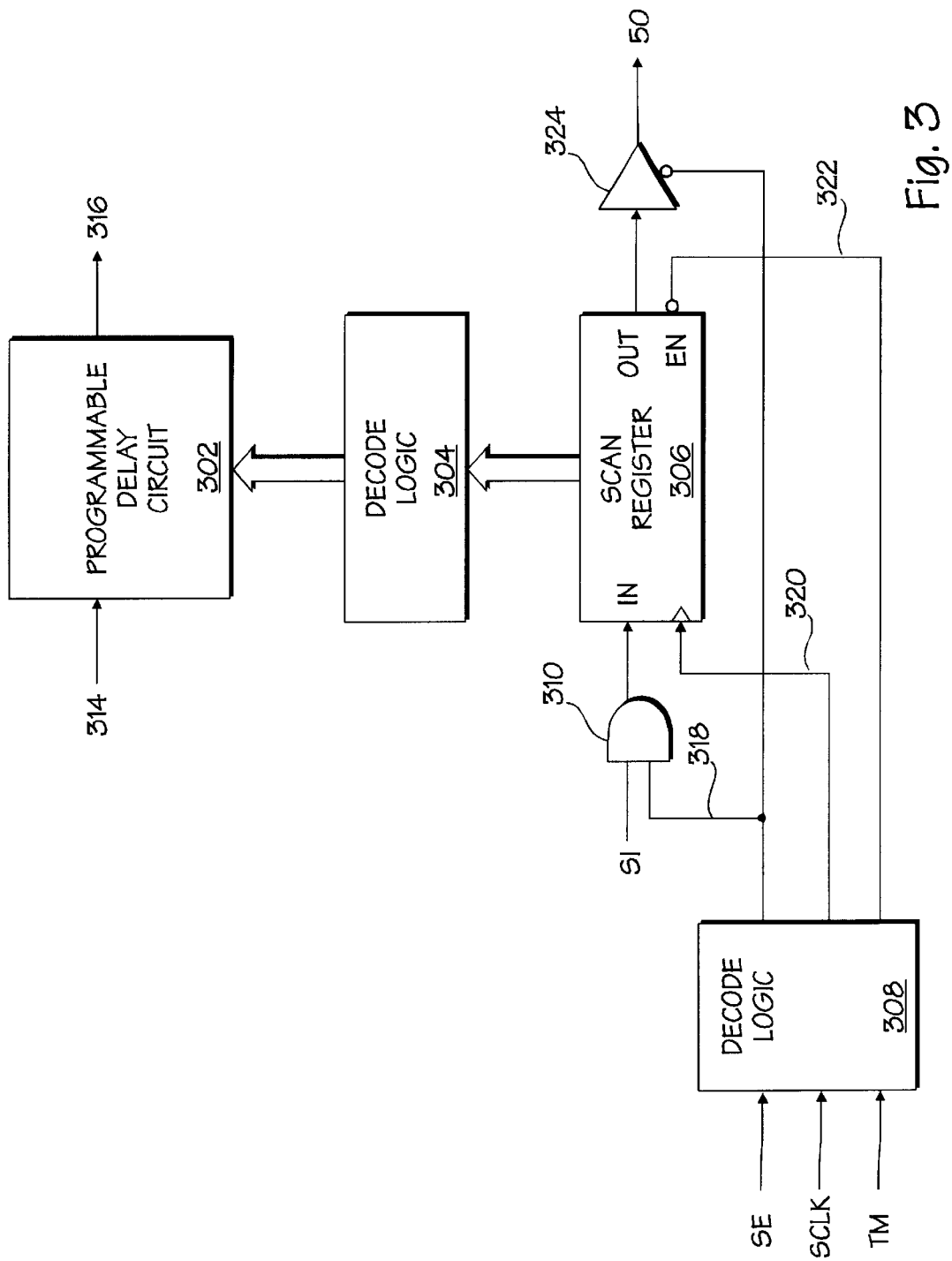
FIG. 3 shows a block diagram of one embodiment of the programmable scan interface of FIG. 2.

FIG. 3 shows an exemplary programmable scan interface 212. Programmable scan interface 212 includes decode logic 308 for implementing the various states generated by test mode and scan enable signals, scan register 306 for storing scan bits or test words, decode logic 304 for decoding the scan bits, and programmable delay circuit 302 for providing a variable delay path such that a signal on line 314 is delayed by a time determined by, for example, one or more bits in scan register 306. A delayed signal may be output on line 316.

Scan register 306 is a shift register that serially shifts in one bit of data through its input (e.g., IN) and simultaneously shifts out one bit of data through its output (e.g., OUT) for every clock cycle on line 320. Scan data stored in shift register 306 may be output in parallel to decode logic 304 when an enable/control signal is asserted (e.g., EN input from decode logic 308 on line 322). Scan register 306 may be any register generally known in the art that performs these functions. Alternatively, scan bits may be loaded into and read from scan register 306 in parallel.

An exemplary operation and protocol implemented by programmable scan interface 212 may be described with respect to Table 1. In state one, TM and SE are low, and decode logic 308 generates inactive (e.g., high) states on lines 318 and 322. This disables the clock provided on line 320 and data is not shifted into scan register 306. Additionally, scan data is not output to decode logic 304 as the enable input is inactive.

In state two, SE is high and TM is low. Decode logic 308 may then (a) assert an active output enable signal on line 318 and (b) enable the clock on line 320 such that data may be shifted into scan register 306 via OR gate 310. Simultaneously, data is shifted out to enabled three state buffer 324. Three-state buffer 324 may then output the bits shifted out of register 306 to generate an output signal (e.g., shift data output signal SO). In state two, however, decode logic 308 preferably continues to assert an inactive (e.g., high) state on line 322 such that scan register 306 does not output the scan bits to decode logic 304.

Three-state buffer 324 may be excluded from programmable scan interface 212. Three-state buffer 324 is useful, however, if its output is multiplexed, for example, with another pin or with a plurality of other locations. In this configuration, three-state buffer 324 may be enabled when state two is enabled, and may be disabled when SRAM 200 operates in the default mode. In addition, three-state buffer 324 may allow scan register 306 to be tested prior to use as part of the test modes described herein.

In state three, SE is low and TM is high. In response thereto, decode logic 308 may activate the signal on line 318 high and disable the clock on line 320, thus disabling three-state buffer 324 and disabling the shifting function of scan register 306. Additionally, and/or alternatively, decode logic 308 may activate a parallel output of bits from scan register 306 to decode logic 304 in response to an active (e.g., low) state on line 322. Decode logic 304 may then decode one or more of the scan bits to program or select a delay path in programmable delay circuit 302. The signal delayed on line 314 by programmable delay circuit 302 may be any internal or external signal of SRAM 200, and preferably includes a signal selected from the group including a clock signal (e.g., CLK, CCPULSE, or SACLK), a word enable, a write enable, a chip enable, a column enable, a column select signal, etc.

In state four, SE is high and TM is high. This state is not used and may be mapped to the same function as state one by decode logic 308.

Figure 13:
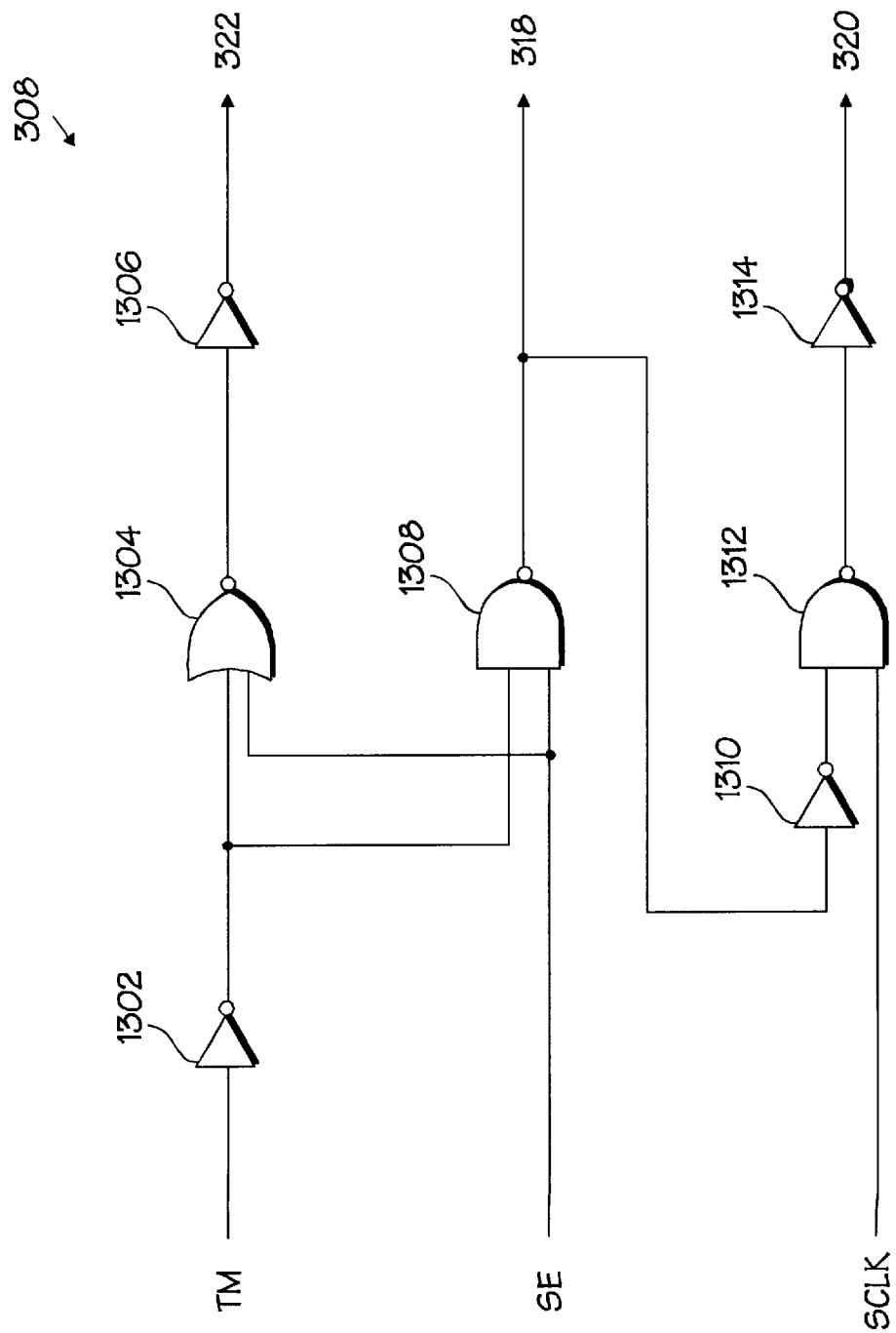
FIG. 13 shows a circuit diagram of one embodiment of decode logic 308 of FIG. 3.

FIG. 13 shows an exemplary decode logic 308. Decode logic 308 includes inverter 1302 having an input coupled to TM, and an output coupled to the first input of NOR gate 1304 and the first input of NAND gate 1308. NOR gate 1304 and NAND gate 1308 each have a second input coupled to SE. NOR gate 1304 has an output coupled to the input of inverter 1306. The output of inverter 1306 is coupled to line 322. The output of NOR gate 1308 is coupled to line 318 and to the input of inverter 1310. NAND gate 1312 has a first input coupled to the output of inverter 1310 and a second input coupled to SCLK. Inverter 1314 has an input coupled to the output of NAND gate 1312 and an output coupled to line 320.

The bits output by scan register 306 may also be directly coupled to circuitry in SRAM 200 without decoding by decode logic 304. For example, one or more scan bits may activate a bypass, transparency, or flow-through circuit in clock generator circuit 210 to output the external periodic signal (CLK) rather than generating an internal clock signal on line 222. The external clock signal (CLK) may have a different characteristic frequency than CCPULSE on line 222. For another example, one or more scan bits may cause output register 218 to operate in a flow through mode and allow data to pass asynchronously from sense amplifiers 214 to a data bus.

Scan register 306 may store any number of bits to implement a variety of test modes described in more detail below. Preferably, scan register 306 may store $\geq 2$ bits, more preferably $\geq 4$ bits, and most preferably $\geq 8$ bits. FIG. 4 shows one embodiment of the definitions of scan bits or test words that may be stored in scan register 306. For this embodiment, scan register 306 has eight scan bits. The first three scan bits b1–b3 may be decoded to alter, adjust (e.g., increase or decrease) and/or test the timing (e.g., pulse width and/or edge placement) of the sense amplifier clock (e.g., the periodic clock signal SACLK). Scan bit b4 may control whether output registers for data signals output from one side of SRAM 200 (e.g., the right side of SRAM 200) operate in synchronous (clocked) mode, or in an asynchronous (or flow through) mode. Similarly, scan bit b8 may control whether output registers for data signals output from another side of SRAM 200 (e.g., the left side of SRAM 200) operate in synchronous (clocked) mode, or in an asynchronous (or flow through) mode. Scan bit b5 may control whether clock pulse generator 210 outputs an internally generated periodic signal (e.g., clock pulse CCPULSE) on line 222, or outputs an external clock (CLK) on line 222. Scan bits b6–b7 may be decoded to control the pulse width of an internal clock pulse output by clock pulse generator 210. Naturally, one may change the order and/or the function of the scan bits, or may assign one or more bits as third (e.g., "don't care") states).

Programmable Delay Scan Bits

Figure 5:
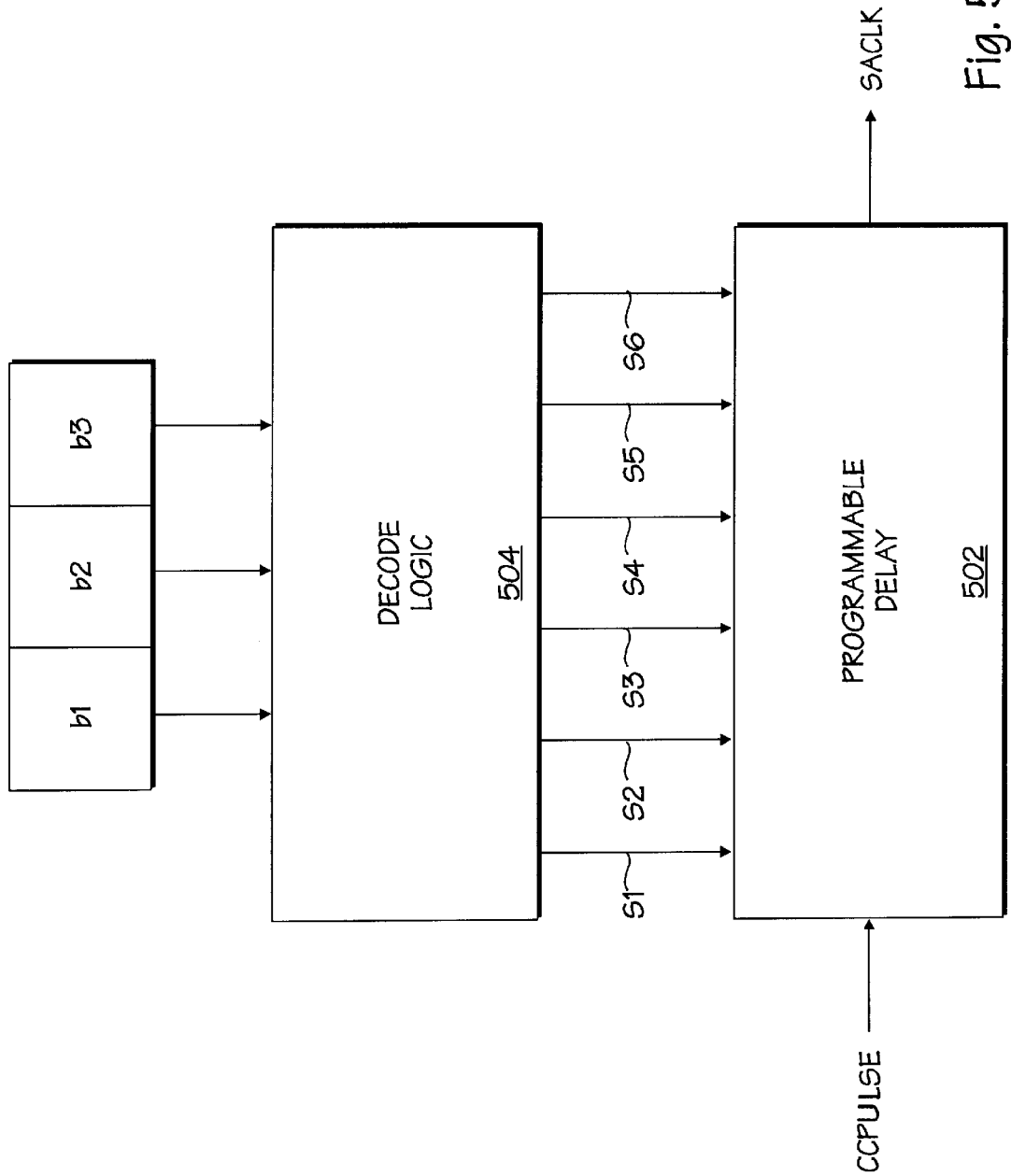
FIG. 5 shows a block diagram of one embodiment of circuitry for decoding bits in a scan register and a programmable delay circuit.

FIG. 5 shows one embodiment of decoding scan bits b1–b3 to provide a programmable delay path or programmable period of time to CCPULSE on line 222, which in turn may adjust the timing of SACLK. As previously described, adjusting or varying the timing of the clock signal input into sense amplifier(s) 214 (SACLK) enables one to characterize timing margins or to determine if timing of the SACLK signal is causing observed errors at the output of output register 210. Adjusting SACLK may also enable the manufacturer or user to selectively tune the speed or performance of SRAM 200.

FIG. 5 shows that scan bits b1–b3 are input into decode logic 504. Decode logic 504 generates a plurality of control signals S1–S6 which cause one of a plurality of programmable delay paths to be coupled to CCPULSE on line 222 and thus adjust the timing of SACLK. The truth table for decode logic 504 is shown in Table 2 below.

TABLE 2

| b1 | b2 | b3 | s1 | s2 | s3 | s4 | s5 | s6 | DELAY PATH |
|----|----|----|----|----|----|----|----|----|------------|
| 0  | 0  | 0  | 0  | 0  | 1  | 0  | 0  | 0  | DEFAULT    |
| 0  | 0  | 1  | 1  | 0  | 0  | 0  | 0  | 0  | FASTEST    |
| 0  | 1  | 0  | 0  | 0  | 1  | 0  | 0  | 0  | DEFAULT    |

TABLE 2-continued

| b1 | b2 | b3 | s1 | s2 | s3 | s4 | s5 | s6 | DELAY PATH |
|----|----|----|----|----|----|----|----|----|------------|
| 0  | 1  | 1  | 0  | 1  | 0  | 0  | 0  | 0  | FASTER     |
| 1  | 0  | 0  | 0  | 0  | 1  | 0  | 0  | 0  | DEFAULT    |
| 1  | 0  | 1  | 0  | 0  | 0  | 1  | 0  | 0  | SLOW       |
| 1  | 1  | 0  | 0  | 0  | 0  | 0  | 1  | 0  | SLOWER     |
| 1  | 1  | 1  | 0  | 0  | 0  | 0  | 0  | 1  | SLOWEST    |

FIG. 14 shows an exemplary decode logic 504 that may implement the truth table of Table 2. Decode logic 504 includes inverters 1402, 1404, and 1406 that receive scan bits b1, b2, and b3, respectively. Decode logic 504 also includes three-input NOR gates 1408, 1410, 1412, 1414, and 1416 that may generate control signals S1, S2, S4, S5, and S6, respectively. Decode logic 504 also includes NAND gates 1418, 1420, and 1422 that may generate control signal S3.

NOR gate 1408 has a first input coupled to scan bit b1, a second input coupled to scan bit b2, and a third input coupled to the output of inverter 1406. NOR gate 1410 has a first input coupled to scan bit b1, a second input coupled to the output of inverter 1404, and a third input coupled to the output of inverter 1406. NOR gate 1412 has a first input coupled to the output of inverter 1402, a second input coupled to scan bit b2, and a third input coupled to the output of inverter 1406. NOR gate 1414 has a first input coupled to the output of inverter 1402, a second input coupled to the output of inverter 1404, and a third input coupled to scan bit b3. NOR gate 1416 has a first input coupled to the output of inverter 1402, a second input coupled of the output of inverter 1404, and a third input coupled to the output of inverter 1406.

NAND gate 1418 has a first input coupled to scan bit b1, a second input coupled to the output of inverter 1404, and a third input coupled to the output of inverter 1406. NAND gate 1420 has a first input coupled to output of inverter 1402, and a second input coupled to the output of inverter 1406. NAND gate 1422 has a first input coupled to the output of NAND gate 1418, and a second input coupled to the output of NAND gate 1420.

Figure 6:
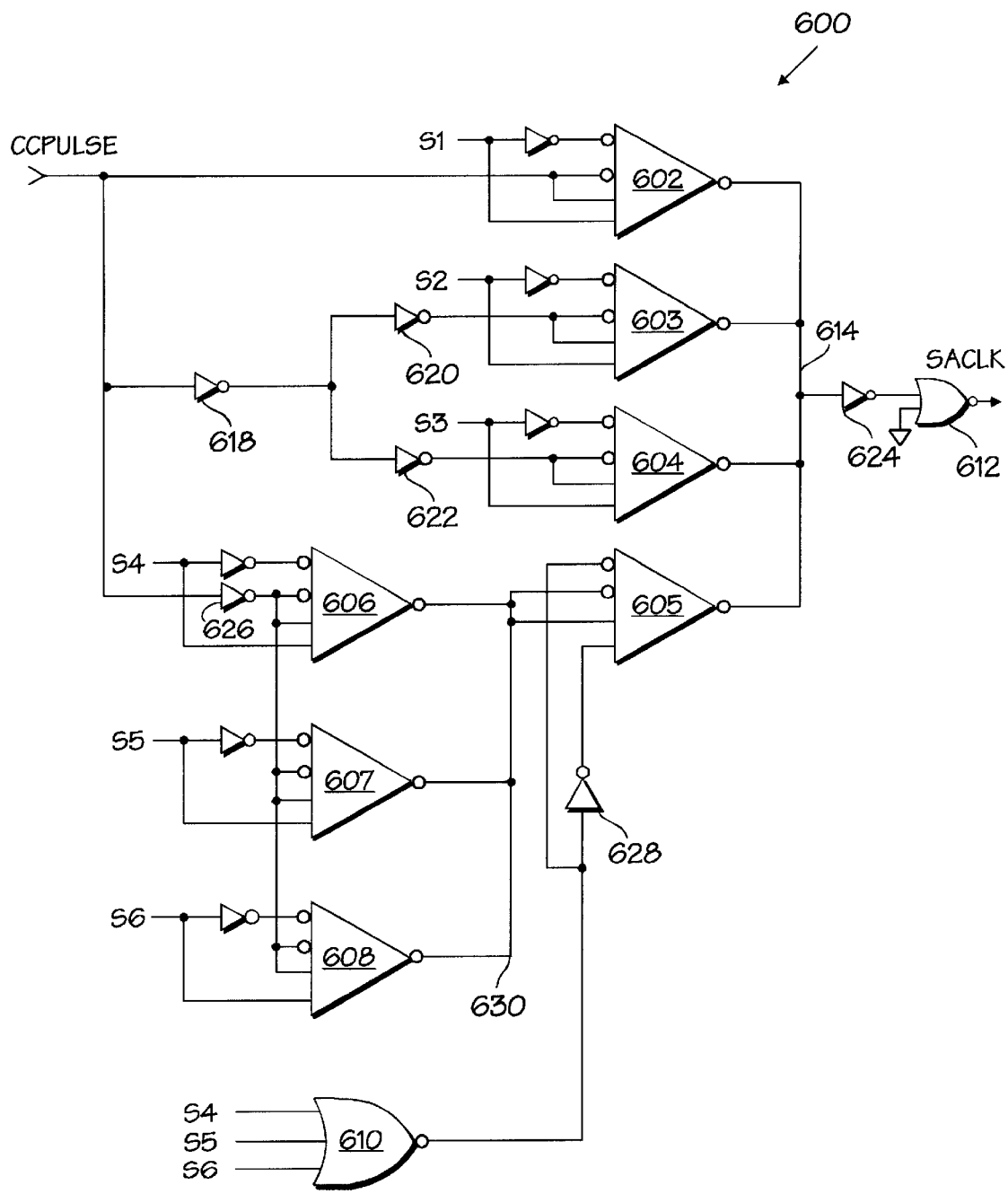
FIG. 6 shows a circuit diagram of one embodiment of the programmable delay circuit of FIG. 5.

As illustrated in Table 2, each of the eight states generated by scan bits b1–b3 causes one of the control signals S1–S6 to be high while all of the other signals remain low. FIG. 6 shows an exemplary programmable delay circuit 600 suitable for programmable delay circuit 502. For an alternative embodiment, programmable delay circuit 600 may advance or slow down any internal or external signal of SRAM 200.

Programmable delay circuit 600 may include a first group of delay elements (e.g., including inverters 602–605), and a second group of delay elements (e.g., including inverters 606–608). Each of the inverters 602–604 is a four input CMOS inverter that receives one of the control signal inputs S1–S3 and its complement, and also receives CCPULSE on line 222. Inverter 605 is a four input CMOS inverter that receives the outputs from inverters 606–608 at node 630 and also receives the output of NOR gate 610 and its complement. The outputs of each of inverters 602–605 is coupled to node 614. NOR gate 612 outputs SACLK and has one its inputs coupled to the complement of node 614 via inverter 624, and its other input coupled to ground. Alternatively, SACLK may be sampled directly from node 614.

Each of the inverters 606–608 may be a four input CMOS inverter (see, for example, transistors 702–708 of FIG. 7) that receives one the control signal inputs S4–S6 and its complement, and also receives the complement of CCPULSE on line 222 via inverter 626.

For the purposes of inverters 602–608 in FIG. 6, an input with a circle denotes a p-channel transistor input and not an inverted input. Similarly, an input without a circle denotes an n-channel transistor input.

Figure 7:
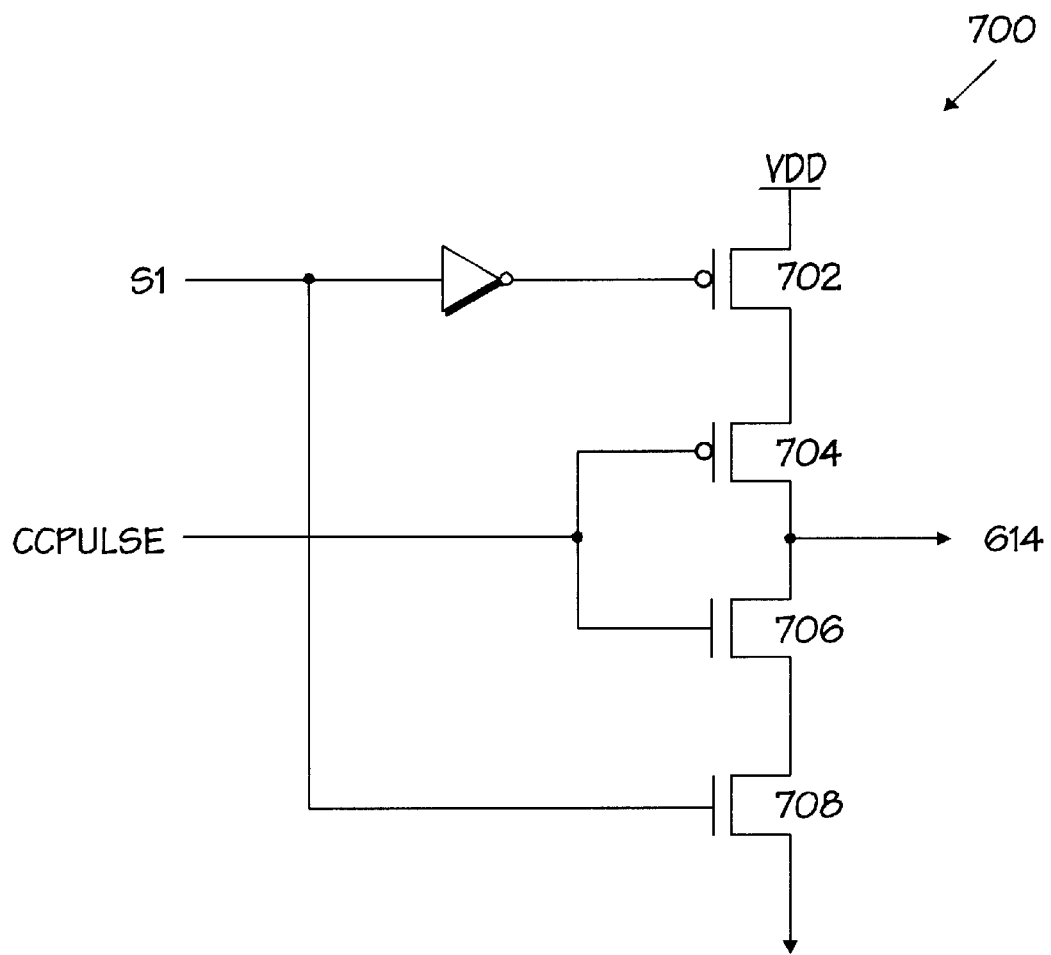
FIG. 7 shows a circuit diagram of one embodiment of a four-input inverter of FIG. 6.

An exemplary embodiment of inverter 602 is shown in FIG. 7 as inverter 700. Inverter 700 includes p-channel transistor 702 coupled in series with p-channel transistor 704, and n-channel transistor 706 coupled in series with n-channel transistor 708. P-channel transistor 702 has its source coupled to VDD, its gate coupled to the complement of control signal S1, and its drain coupled to the source of p-channel transistor 704. P-channel transistor 704 further has its gate coupled to CCPULSE, and its drain coupled to node 614 and the drain of n-channel transistor 706. N-channel transistor 706 further has its gate coupled to CCPULSE, and its source coupled to the drain of n-channel transistor 708. N-channel transistor 708 further has its gate coupled to control signal S1. For an alternative embodiment, S1 may be coupled to the gates of transistors 704 and 706, and CCPULSE may be coupled to the gates of transistors 702 and 708. Each of the inverters 602–608 may be similarly constructed from a series of two p-channel transistors and two n-channel transistors.

The drive capabilities of inverters 602–605 are staggered such that, relative to each other, inverter 602 has a large amount of drive, inverter 603 has a moderate amount of drive, inverter 604 has a small amount of drive, and inverter 605 has a very small amount of drive. In a similar fashion, the drive capabilities of inverters 606–608 are staggered such that, relative to each other, inverter 606 has a large amount of drive, inverter 607 has a moderate amount of drive, and inverter 608 has a small amount of drive. Through this configuration, approximately six different delay paths may be provided to the clock signal on line 222 and SACLK. The first three delay paths respectively include a path through each of inverters 602–604, and the other three delay paths respectively include a path through the inverter combinations of 606 and 605, 607 and 605, and 608 and 605.

The relative amounts of drive provided by inverters 603–608 may be generated by various processing techniques, including sizing transistor width-to-length ratios, altering doping concentration of source, drain, or gate area, etc.

NOR gate 610 receives control signals S4–S6 and has its output coupled to one p-channel input of inverter 605, and the complement of its output coupled to one n-channel input of inverter 605 via inverter 628. If any one of the control signals S4–S6 is active, one of the three paths through inverters 606–608 and inverter 605 is enabled.

The operation of programmable delay circuit 600 may be described with respect to Table 2. When scan bits b1–b3 are either 000, 010, or 100, respectively, decode logic 502 will generate 001000 on control lines S1–S6, respectively. This will enable a default delay path through inverter 604. With inverter 604 enabled, SACLK will be produced from CCPULSE after delays through inverters 618, 622, 604, 624, and NOR gate 612. For one embodiment this amount of delay may be from approximately 300 picoseconds to 1.5 nanoseconds. For example, this delay may be approximately 800 picoseconds. Other amounts of delay may be used.

When scan bits b1–b3 are 001, respectively, decode logic 502 will generate 100000 on control lines S1–S6, respectively. This will enable a delay path through inverter 602. With inverter 602 enabled, SACLK will be produced from CCPULSE after delays through inverters 602 and 624, and NOR gate 612. For one embodiment this amount of delay may be approximately 200 to 400 picoseconds faster than the default delay path through inverter 604. For example, this amount of delay may be approximately 300 picoseconds faster than the delay path through inverter 604. Other amounts of delay may be used depending on the extreme timing conditions to be tested or programmed.

When scan bits b1–b3 are 011, respectively, decode logic 502 will generate 010000 on control lines S1–S6, respectively. This will enable a delay path through inverter 603. With inverter 603 enabled, SACLK will be produced from CCPULSE after delays through inverters 618, 620, 603, 624, and NOR gate 612. For one embodiment this amount of delay may be approximately −50 to 200 picoseconds faster than the default delay path through inverter 604. For example, this amount of delay may be approximately 100 picoseconds faster than the delay path through inverter 604. Other amounts of delay may be used.

When scan bits b1–b3 are 101, respectively, decode logic 502 will generate 000100 on control lines S1–S6, respectively. This will enable a delay path through inverters 606 and 605. SACLK will be produced from CCPULSE after delays through inverters 626, 606, 605, 624, and NOR gate 612. For one embodiment this amount of delay may be approximately 50 to 200 picoseconds slower than the default delay path through inverter 604. For example, this amount of delay may be approximately 135 picoseconds slower than the delay path through inverter 604. Other amounts of delay may be used.

When scan bits b1–b3 are 110, respectively, decode logic 502 will generate 000010 on control lines S1–S6, respectively. This will enable a delay path through inverters 607 and 605. SACLK will be produced from CCPULSE after delays through inverters 626, 607, 605, 624, and NOR gate 612. For one embodiment this amount of delay may be approximately 200 to 450 picoseconds slower than the default delay path through inverter 604. For example, this amount of delay may be approximately 340 picoseconds slower than the delay path through inverter 604. Other amounts of delay may be used.

When scan bits b1–b3 are 111, respectively, decode logic 502 will generate 000001 on control lines S1–S6, respectively. This will enable a delay path through inverters 608 and 605. SACLK will be produced from CCPULSE after delays through inverters 626, 608, 605, 624, and NOR gate 612. For one embodiment this amount of delay may be approximately 450 to 800 picoseconds slower than the default delay path through inverter 604. For example, this amount of delay may be approximately 600 picoseconds slower than the delay path through inverter 604. Other amounts of delay may be used.

For other embodiments, programmable delay circuit 600 may be adapted to provide eight separate delay paths in response to the decode of bits b1–b3. Alternatively, a different number of scan bits may be decoded to provide any number of delay paths in programmable delay circuit 600. Generally, n scan bits may be decoded by decode logic 504 to produce $\geq 2^n$ control signals.

Register Control Scan Bits

Scan bits b4 and b8 may enable output registers such as output register 218 of FIG. 2 to switch between synchronous and asynchronous operation modes. As previously described, in the synchronous mode, output register 218 may mask the observability of the function of memory core 206 and may lead to incorrect or imprecise conclusions as to where a problem may exist in SRAM 200. Thus, scan bits b4 and b8 can be programmed using the protocol described above with respect to Table 1 to cause one or more output registers to switch to an asynchronous or flow through mode. In the asynchronous mode, data is passed through the output register in a non-synchronous fashion. This test mode may be used in conjunction with other test modes to monitor the effects that internals signal changes may have on the operation of SRAM 200.

Scan bit 4 may be used to control the operating mode of output registers for data outputs that may be physically located on one side of SRAM 200 (e.g., the right side). Scan bit 8 may be used to control the operating mode of output registers for data outputs that may be physically located on another side of SRAM 200 (e.g., the left side). Alternatively, one bit may control the synchronous/asynchronous operation of all output registers. These bits may alternatively control any register, or groups of registers, in SRAM 200.

Figure 8:
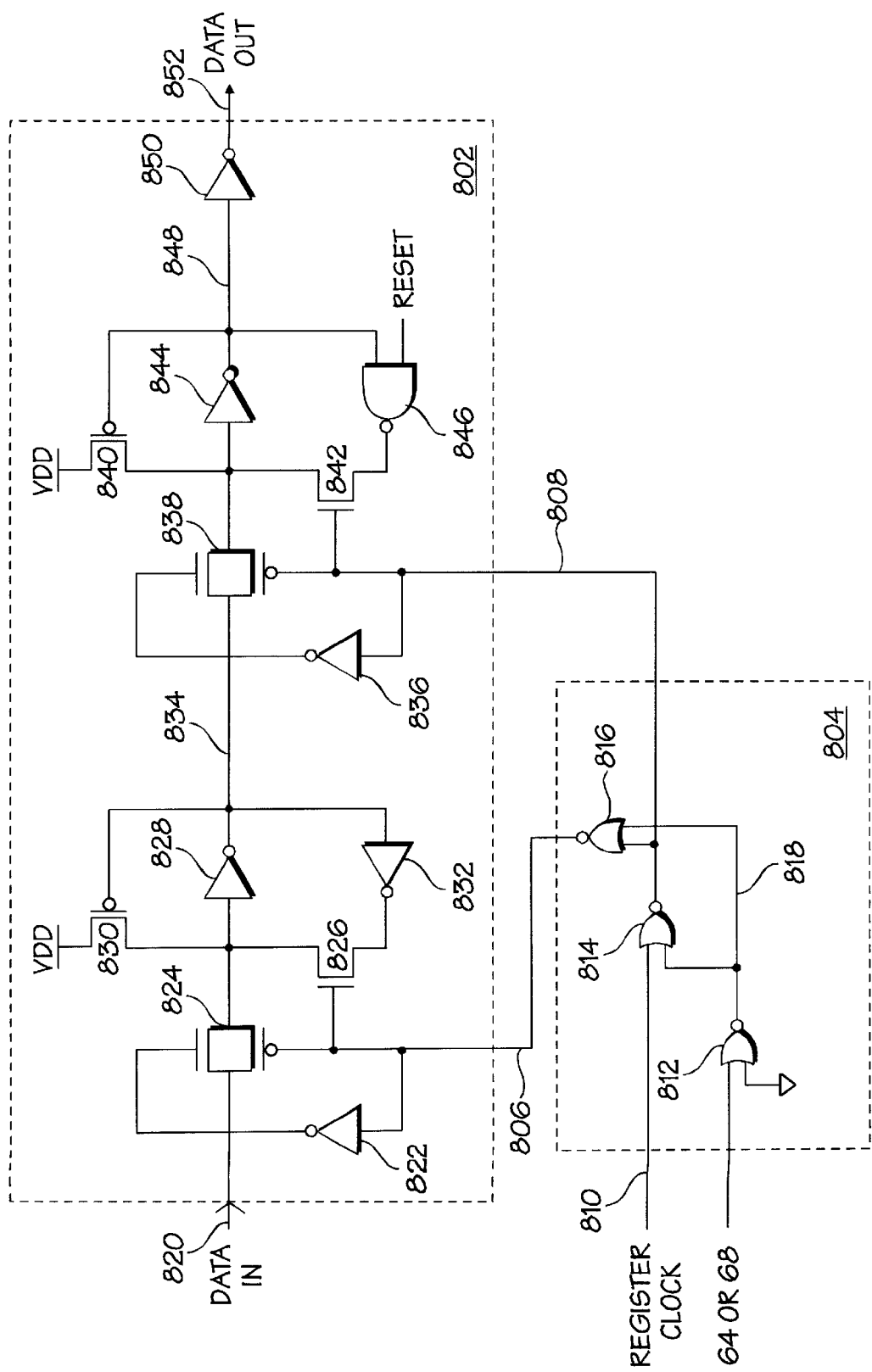
FIG. 8 shows a circuit diagram of one embodiment of a clocked output register having a flow through mode according the present invention.

FIG. 8 shows one embodiment of a clocked register 802 suitable for use as address register 202, input register 216 and/or output register 218 (see FIG. 2) and, that may be configured to operate synchronously or asynchronously in response to a control signal generated from scan register control bits (e.g., b4 or b8). Clocked register 802 has a master stage and a slave stage.

The master stage includes inverter 822, CMOS transmission gate 824, transistors 830 and 826, and inverters 828 and 832. Inverter 822 has its input coupled to line 806 and its output coupled to the n-channel gate of CMOS transmission gate 824. CMOS transmission gate 824 has its p-channel gate coupled to line 806 and passes input data from line 820 to the input of inverter 828. The input of inverter 828 is also coupled to the drain of p-channel transistor 830 and the source/drain of n-channel transistor 826. The output of inverter 828 is coupled to node 834. P-channel transistor 830 has its source coupled to VDD, and its gate coupled to node 834. N-channel transistor 826 has its gate coupled to line 806, and its drain/source coupled to the output of inverter 832. The input of inverter 832 is coupled to node 834.

The slave stage includes inverter 836, CMOS transmission gate 838, transistors 840 and 842, inverter 844, and NAND gate 846. Inverter 836 has its input coupled to line 808 and its output coupled to the n-channel gate of CMOS transmission gate 838. CMOS transmission gate 838 has its p-channel gate coupled to line 808 and passes input data from node 834 to the input of inverter 844. The input of inverter 844 is also coupled to the drain of p-channel transistor 840 and the source/drain of n-channel transistor 842. The output of inverter 844 is coupled to node 848. P-channel transistor 840 has its source coupled to VDD, and its gate coupled to node 848. N-channel transistor 842 has its gate coupled to line 808, and its drain/source coupled to the output of NAND gate 846. NAND gate 846 has one input coupled to node 848 and the other input coupled to reset signal RESET. When RESET is asserted low, NAND gate 846 will drive the input of inverter 844 to a high state via transistor 842 to cause a known state at data output 852 via inverters 844 and 850.

Clock generator or control circuit 804 includes NOR gates 812, 814, and 816 that generate two clock signals on lines 806 and 808 in response to a register clock signal on line 810 and either of scan bits b4 or b8. The register clock signal on line 810 may be CCPULSE on line 222 of FIG. 2, or may be any other buffered version of CCPULSE.

NOR gate 812 has one input coupled to ground and the other input coupled to either of scan bits b4 or b8. NOR gate 812 generates an intermediate signal on line 818. NOR gate 814 generates the clock signal on line 808 in response to the intermediate signal on line 818 and the register clock on line 810. NOR gate 816 generates the clock signal on line 806 in response to the intermediate signal on line 818 and the clock signal on line 808.

Clock register 802 operates in a synchronous mode when scan bit b4 or b8 is high. This causes the intermediate signal on line 818 to be low and enables NOR gates 814 and 816 to output clock signals on lines 808 and 806, respectively. The clock signals on lines 814 and 816 are the complements of each other and follow the register clock on line 810. Thus, when the clock signal on line 806 is low, transmission gate 824 will allow the complement of the input data signal on line 820 to be passed through to node 834 via inverter 828. Feedback inverter 832 will stabilize the signal at node 834. While the input data is being clocked through to node 834, the clock signal on line 808 is high such that no data is clocked through to node 848. When the clock signal on line 806 transitions to a high state, transmission gate 824 will shut off. The clock signal on line 808 will transition to a low state and enable the complement of the data signal at node 834 to be passed through to node 848 via inverter 844. The complement of the data at node 848 may then be provided as the data output signal at node 852 by inverter 850.

Clock register 802 operates in an asynchronous or flow through mode when scan bit b4 or b8 is low. This causes the intermediate signal on line 818 to be high and causes NOR gates 814 and 816 to output low states on lines 808 and 806, respectively. CMOS transmission gates 824 and 838 become active on response thereto, enabling the input data at node 820 to be passed asynchronously (immediately, rather than as gated by a periodic clock signal) through both the master stage and the slave stage as the data output signal at node 852.

Other embodiments of clocked output register 802 may be used. For example, different types of transmission gates or pass gates may be used to replace CMOS transmission gates 824 and 838 (e.g., either an n-channel or a p-channel transistor having its gate coupled to line 806 or 808, without corresponding inverter 822 and 836). Additionally, transistors 830, 840, 826, and 842 may be omitted, feedback inverter 832 and NAND gate 846 may be omitted, and inverter 850 may also be omitted.

Programmable Pulse Width Bits

Figure 9:
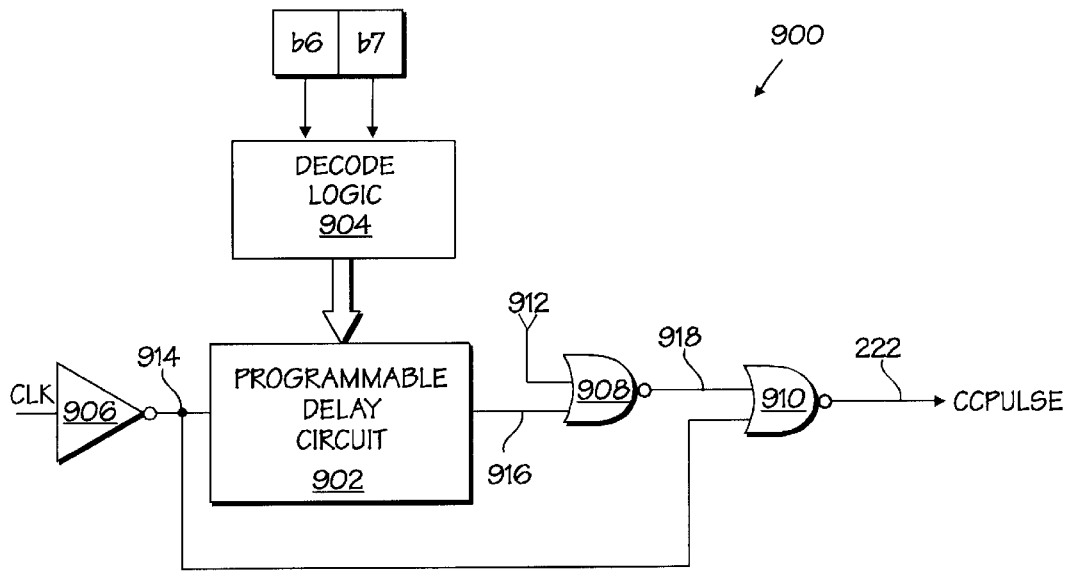
FIG. 9 shows a circuit diagram of one embodiment of a programmable clock pulse generator circuit.

FIG. 9 shows one embodiment of a clock pulse generator 900 suitable for clock pulse generator 210 of FIG. 2. Clock pulse generator 900 generates a variable width clock pulse in response to scan bits b6 and b7.

Clock pulse generator 900 may include inverter 906 for receiving and inverting the external clock signal CLK. The output of inverter 906 is coupled to line 914 and the input of programmable delay circuit 902. The output of programmable delay circuit 902 is coupled to one input of NOR gate 908 at line 916. The other input of NOR gate 908 is coupled to line 912. For one example, line 912 may carry bit 5 of scan register 706 of FIG. 3. The output of NOR gate 908 is coupled to one input of NOR gate 910. The other input of NOR gate 910 is line 914. NOR gate 910 outputs an internally generated clock signal (e.g., CCPULSE) on line 222 (see FIG. 2).

Decode logic 904 decodes scan bits b6–b7 to program the amount of delay provided by programmable delay circuit 902 to the signal on line 914. The pulse width of the signal on line 222 will be directly proportional to the amount of delay provided by programmable delay circuit 902. Adjusting the pulse width of the signal on line 222 enables one to characterize timing margins or to determine if the timing of the signal on line 222 is causing observed errors at the output of output register 218. Adjusting the signal on line 222 may also enable the manufacturer or user to selectively tune the speed or performance of SRAM 200.

Figure 10:
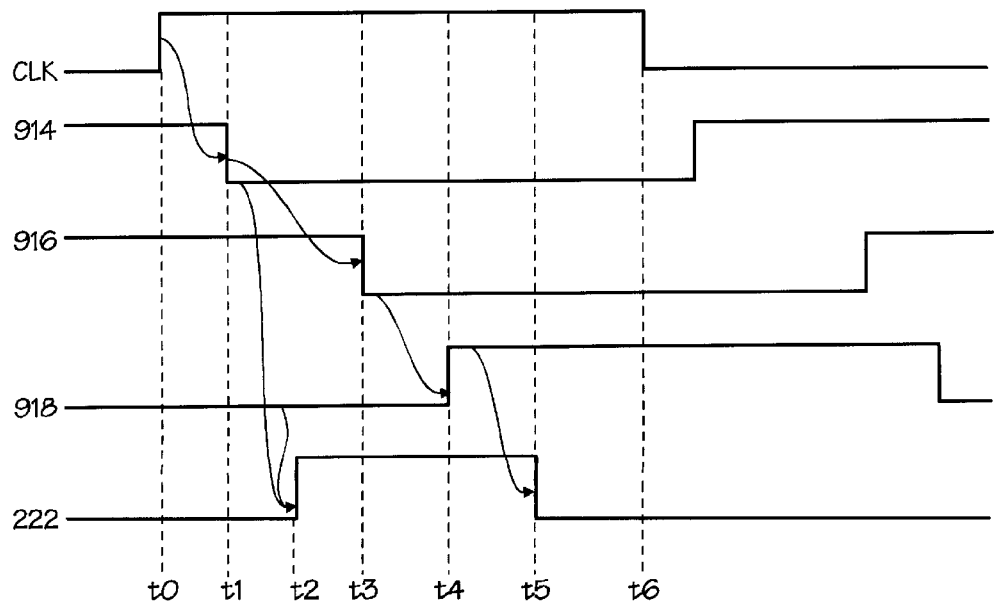
FIG. 10 shows an exemplary timing diagram of the operation of the programmable clock pulse generator circuit of FIG. 9.

The operation of clock pulse generator 900 may be described with respect to the exemplary timing diagram of FIG. 10. At time t0, the signal on line 912 is held low and CLK transitions from a low to a high state. The signal on line 914 will transition to a low state at time t1 after a delay through inverter 906. Subsequently, the signal on line 222 will transition to a high state at time t2 after a delay characteristic of NOR gate 910. After the programmed delay through programmed delay circuit 902, the signal on line 916 will transition to a low state at time t3. This will cause the signal on line 918 to transition to a high state after a delay characteristic of NOR gate 908. The signal on line 222 then transitions to a low state after the characteristic delay of NOR gate 910 in response to the line 918 transition.

As illustrated by FIG. 10, a rising edge of CLK will result in the rising edge of the signal on line 222. The falling edge of the signal on line 222 will be produced after the programmable delay through programmable delay circuit 902 (e.g., after a time delay of $t_5-t_0$). The falling edge of the signal on line 222 does not depend on the falling edge of CLK; rather, it is directly proportional to the amount of programmable delay provided by programmable delay circuit 902 (and, if present, the delay characteristic of NOR gates 908 and 910). Clock pulse generator 900 may include one or more programmable delay circuits 902.

Figure 11A:
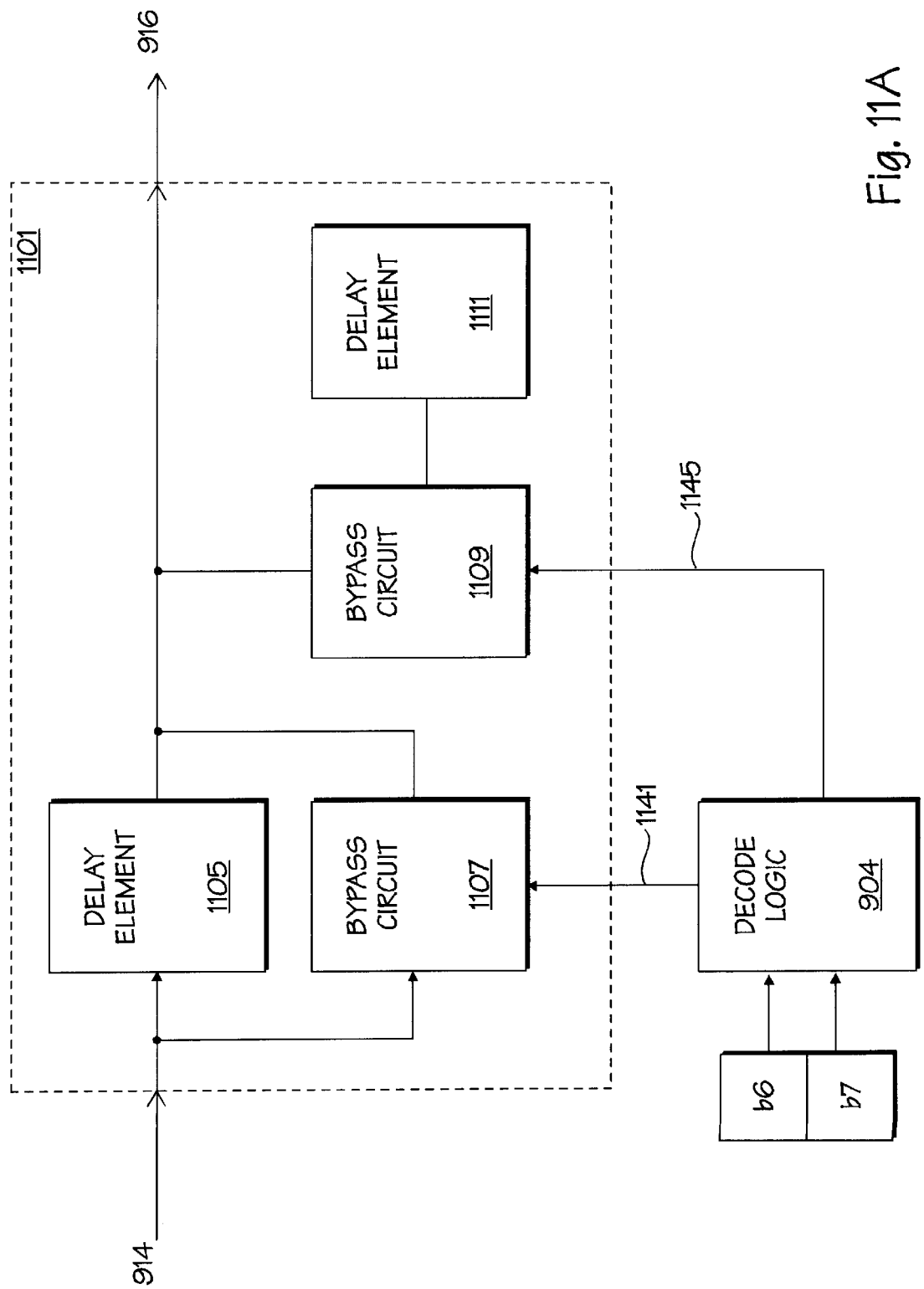
FIG. 11A shows a block diagram one embodiment of decoding circuitry and a programmable delay circuit.

FIG. 11A shows an exemplary programmable delay circuit 1101 that is suitable for use as programmable delay circuit 902 of FIG. 9. Programmable delay circuit 1101 may include a first delay element 1105, a first bypass circuit 1107, a second delay element 1111, and a second bypass circuit 1109. In response to bits b6 and b7, decode logic 904 may enable/disable bypass circuits 1107 and 1109 through control signals on lines 1141 and 1145, respectively.

Delay elements 1105 and 1111 may be one or more of any type of delay elements including resistors, capacitors, inverters, etc. Bypass circuits 1107 and 1109 may be one or more of any type of bypass circuits including transmission gates, pass gates, three-state buffers or inverters, etc.

When bypass circuit 1107 is enabled, the signal on line 914 may propagate through bypass circuit 1107 faster than it may propagate through delay element 1105 (if it even propagates through delay element 1105 at all). When bypass circuit 1107 is disabled, the signal on line 914 may propagate through delay element 1105 faster than it propagates through bypass circuit 1107 (if it propagates through bypass circuit 1107 at all). When bypass circuit 1109 is enabled, the signal on line 916 may be delayed by delay element 1111. When bypass circuit 1109 is disabled, the signal on line 916 may be decoupled from, and not experience a delay from, delay element 1111.

In response to bits b6 and b7, programmable delay circuit 1101 may output the signal on line 916 at varying amounts of time after receiving the signal on line 914. For example, in response to bits b6 and b7 up to four states may be generated by decode logic 904 corresponding to up to four different amounts of delays that may be introduced into the path of the signal on line 914, including: (1) a first delay path when bypass circuit 1107 is enabled and bypass circuit 1109 is disabled; (2) a second delay path when bypass circuit 1107 is disabled and bypass circuit 1109 is enabled; (3) a third delay path when bypass circuits 1107 and 1109 are disabled; and (4) a fourth delay path when bypass circuits 1107 and 1109 are enabled. The first delay path may be the shortest delay path, and the second delay path may be the longest delay path.

Programmable delay circuit 1101 may alternatively include additional delay element/bypass circuit pairs that may be configured to provide additional delays to the signal on line 914 in response to one or more bits from scan register 306.

Figure 11B:
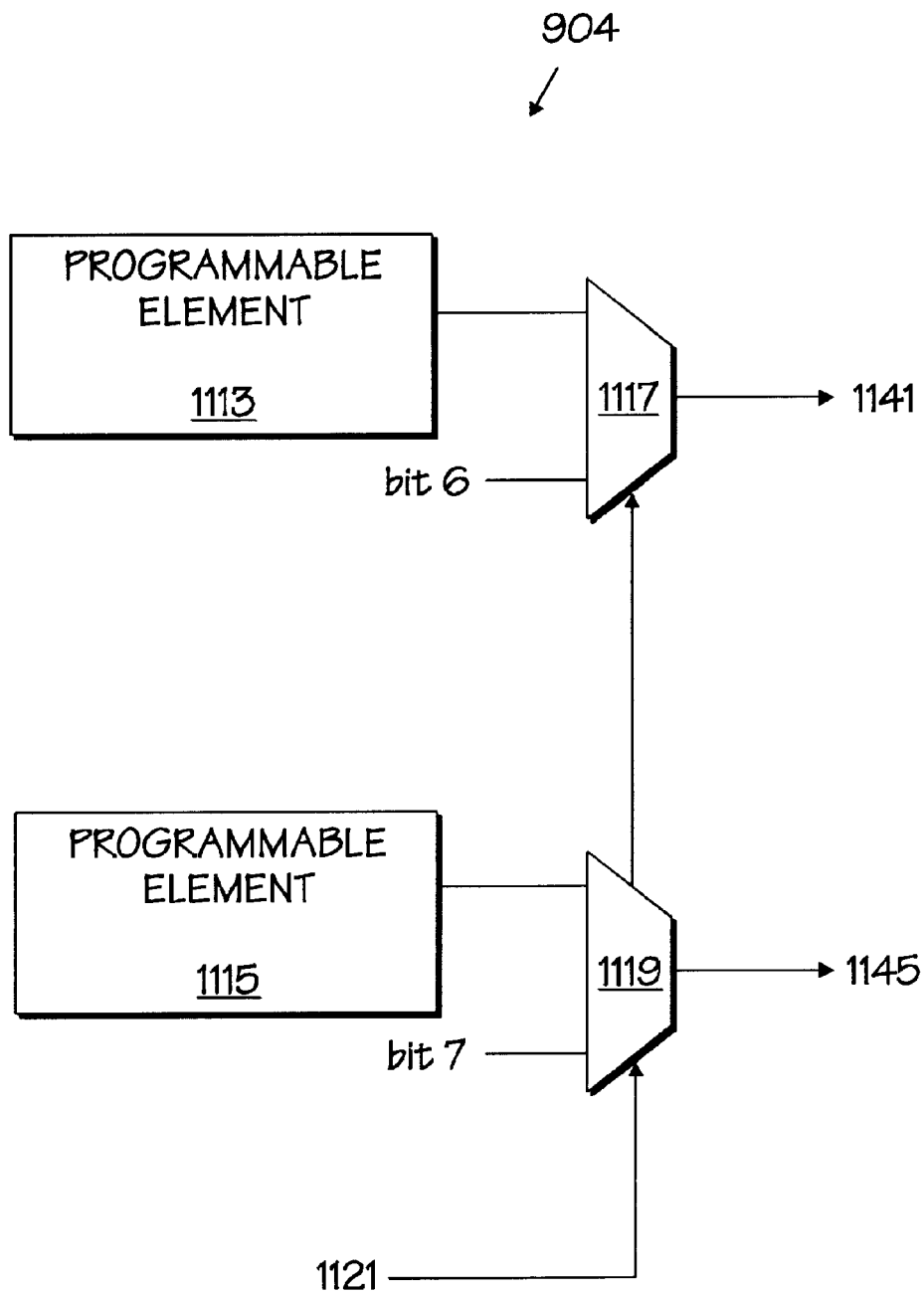
FIG. 11B shows a circuit diagram of one embodiment of decoding circuitry of FIG. 9.

FIG. 11B shows an exemplary embodiment of decode logic 904. Decode logic 904 may be programmable such that a desired delay path may be programmed as a default delay path for programmable delay circuit 1101 of FIG. 11A. Decode logic 904 may include two multiplexer or selector circuits 1117 and 1119 that may output the control signals on lines 1141 and 1145, respectively. Multiplexer 1117 may receive a signal from a first programmable storage element 1113 and a bit from scan register 306 (e.g., bit b6). Multiplexer 1119 may receive a signal from a second programmable storage element 1115 and a bit from scan register 306 (e.g., bit b7). In response to a select signal on line 1121, multiplexers 1117 and 1119 may output to lines 1141 and 1145, respectively, default settings programmed into programmable elements 1113 and 1115, respectively, or the states of bits b6 and b7. For one embodiment, the signal on line 1121 may be the signal on line 322 of FIG. 3. For an alternative embodiment, multiplexers 1117 and 1119 may each receive separate select signals.

In operation, one or more combinations of bits b6 and b7 may be supplied to bypass circuits 1107 and 1109 of FIG. 11A such that different amounts of delay may be introduced to the signal on line 914 (and subsequently the signal on line 916). The device under test (e.g., SRAM 200) may then be tested, observed and/or characterized. After completing these tests or measurements, a particular bit combination of bits b6 and b7 may be programmed as a default setting into programmable elements 1113 and 1115, respectively. Multiplexers 1117 and 1119 may then be configured to output signals from programmable elements 1113 and 1115 to lines 1141 and 1145, respectively, in response to the select signal on line 1121.

The programmable elements 1113 and 1115 may be any type of programmable element including a fuse (e.g., laser, metal, electrical, etc.), programmable read only memory (PROM), electrically programmable read only memory (EPROM), electrically erasable read only memory (EEPROM), flash memory cell, etc.

Figure 11C:
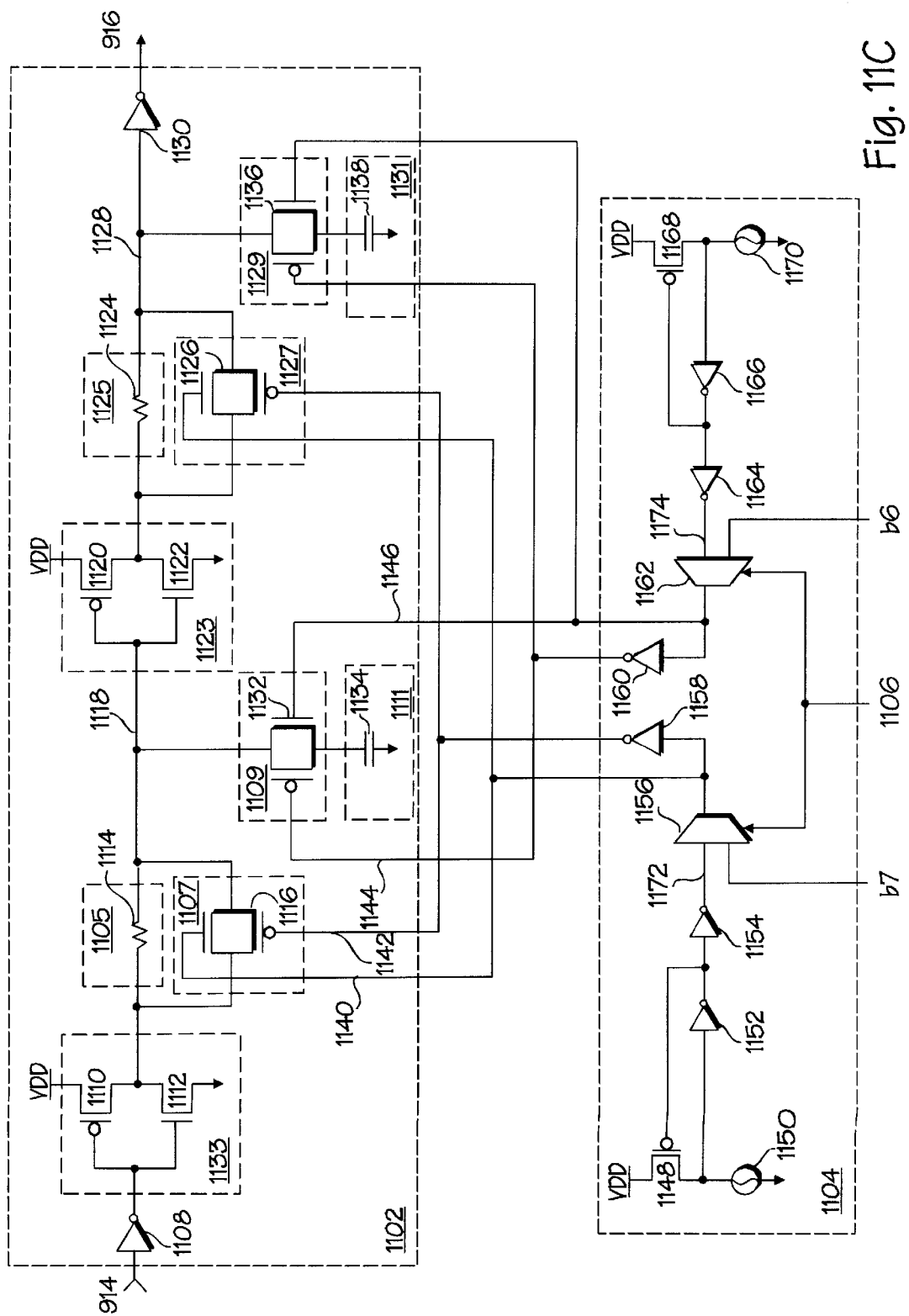
FIG. 11C shows a circuit diagram of another embodiment of decoding circuitry and a programmable delay circuit.

FIG. 11C shows an exemplary programmable delay circuit 1102 suitable for use as programmable delay circuit 1101 of FIG. 11A. FIG. 11C also shows exemplary decode logic 1104 suitable for use as decode logic 904 of FIG. 9 or FIG. 11B.

Programmable delay circuit 1102 may include two delay stages (or any number of identical or non-identical delay stages). The first delay stage may include inverters 1108 and 1109, delay element 1105 that may include resistor 1114, bypass circuit 1107 that may include CMOS transmission gate 1116, bypass circuit 1109 that may include CMOS transmission gate 1132, and delay element 1111 that may include capacitor 1134. Inverters 1108, 1109, 1123 and 1130 are optional. Inverters 1108 and 1109 are serially coupled together and output the signal on line 914 to one terminal of resistor 1114. The other terminal of resistor 1114 is coupled to node 1118 and CMOS transmission gate 1132. Resistor 1114 is coupled in parallel with CMOS transmission gate 1116. CMOS transmission gate 1116 has its p-channel gate input coupled to line 1142, and its n-channel gate input coupled to line 1140. CMOS transmission gate 1116 may be enabled or disabled to bypass resistor 1114 in response to the signals on lines 1140 and 1142. CMOS transmission gates 1116 and 1134 may be replaced by one or more n-channel or p-channel pass transistors and may eliminate one or more of inverters 1154, 1158, 1160 and/or 1164.

CMOS transmission gate 1132 is coupled to one terminal of capacitor 1134, and the other terminal of capacitor 1134 is coupled to ground. CMOS transmission gate 1132 has its p-channel gate input coupled to line 1144, and its n-channel gate input coupled to line 1146. CMOS transmission gate 1132 may be enabled or disabled to couple the signal on line 1118 to bypass capacitor 1134 in response to the signals on lines 1144 and 1146.

The second delay stage may include inverters 1123 and 1130, a delay element 1125 that may include resistor 1124, a bypass circuit 1127 that may include CMOS transmission gate 1126, a bypass circuit 1136 that may include CMOS transmission gate 1136, and a delay element 1131 that may include capacitor 1138. Inverter 1123 inverts the signal at node 1118 and has its output coupled to one terminal of resistor 1124. The other terminal of resistor 1124 is coupled to node 1128 and CMOS transmission gate 1136. Resistor 1124 is coupled in parallel with CMOS transmission gate 1126. Inverter 1130 outputs the inverted signal from node 1128 to line 916. CMOS transmission gate 1126 has its p-channel gate input coupled to line 1142, and its n-channel gate input coupled to line 1140. CMOS transmission gate 1126 may be enabled or disabled to bypass resistor 1124 in response to the signals on lines 1140 and 1142. CMOS transmission gates 1126 and 1136 may be replaced by one or more n-channel or p-channel pass transistors and may eliminate one or more of inverters 1154, 1158, 1160, and/or 1164.

CMOS transmission gate 1136 is coupled to one terminal of capacitor 1138, and the other terminal of capacitor 1138 is coupled to ground. CMOS transmission gate 1136 has its p-channel gate input coupled to line 1144, and its n-channel gate input coupled to line 1146. CMOS transmission gate 1136 may be enabled or disabled to couple the signal on line 1128 to bypass capacitor 1138 in response to the signals on lines 1144 and 1146.

CMOS inverter 1109 includes p-channel transistor 1110 coupled to n-channel transistor 1112. CMOS inverter 1123 includes p-channel transistor 1120 and n-channel transistor 1122. For an alternative embodiment, CMOS inverter 1109 and/or CMOS inverter 1123 may have an additional n-channel transistor coupled in series between n-channel transistors 1112 or 1122 and ground. The gate of the additional n-channel transistor may be coupled to a reference circuit that adjusts the conductance of the additional n-channel transistor in response to changing operating conditions (including process, voltage, and temperature changes) of SRAM 200. For yet another alternative embodiment, CMOS inverter 1109 and/or CMOS inverter 1123 may include a p-channel transistor coupled in series between p-channel transistors 1110 or 1120 and VDD. The gate of the additional p-channel transistor may be coupled to a reference circuit that adjusts the conductance of the additional p-channel transistor in response to changing operating conditions (including process, voltage, and temperature changes) of SRAM 200. Embodiments of such reference circuits are disclosed in co-pending U.S. patent application Ser. No. 8/824,639 entitled Dynamic Voltage Reference, filed by Jon F. Churchill on Mar. 25, 1997 and hereby incorporated by reference.

Decode logic 1104 may include two decode stages. The first decode stage may include a programmable storage element (e.g., laser fuse 1150), transistor 1148, inverters 1152, 1154, and 1158, and multiplexer 1156. The programmable storage element may include a metal fuse, electrical fuse, PROM, EPROM, EEPROM, flash memory cell, etc. When selected, the programmable storage element may be configured to output a predetermined logic level or signal to either increase or decrease the programmable delay of programmable delay circuit 1102. Fuse 1150 has one terminal coupled to ground, and another terminal coupled to the drain of p-channel transistor 1148 and the input of inverter 1152. The gate of p-channel transistor 1148 is coupled to the output of inverter 1152, and the source of transistor 1148 is coupled to VDD. The input of inverter 1154 is coupled to the output of inverter 1152, and the output of inverter 1154 is coupled to one input of multiplexer or select circuit 1156. The other input of multiplexer 1156 is coupled to scan bit b7. Multiplexer 1156 outputs either the output of inverter 1154 or scan bit b7 on line 1140 in response to the select signal on line 1106. For one embodiment the select signal on line 1106 is the signal on line 322 in FIG. 3 which corresponds to a function of the test mode signal TM. The complement of the signal on line 1140 is coupled to line 1142 by inverter 1158.

The second decode stage of decode logic 1104 may include a mirror image of the first decode stage. The second decode stage may include fuse 1170, transistor 1168, inverters 1164, 1166, and 1160, and multiplexer 1162. Fuse 1170 has one terminal coupled to ground, and another terminal coupled to the drain of p-channel transistor 1170 and the input of inverter 1166. The gate of p-channel transistor 1168 is coupled to the output of inverter 1166, and the source of transistor 1168 is coupled to VDD. The input of inverter 1164 is coupled to the output of inverter 1166, and the output of inverter 1164 is coupled to one input of multiplexer or select circuit 1162. The other input of multiplexer 1162 is coupled to scan bit b6. Multiplexer 1162 outputs either the output of inverter 1164 or scan bit b6 on line 1146 in response to the select signal on line 1106. The complement of the signal on line 1146 is coupled to line 1144 by inverter 1160.

When SRAM 200 operates in the test mode as illustrated in Table 1, signal 1106 will cause multiplexers 1156 and 1162 to output scan bits b7 and b6 to lines 1140 and 1146, respectively. The amount of delay provided to the signal on line 914, and subsequently to the pulse width of the signal on line 222, will depend upon the states of scan bits b6 and b7. Table 3 summarizes the states of scan bits b6 and b7 and their effect on the pulse width of the signal on line 222.

TABLE 3

| b6 | b7 | PULSE WIDTH OF SIGNAL ON LINE 222 |
| --- | --- | --- |
| 0 | 0 | DEFAULT |
| 0 | 1 | SHORT PULSE |
| 1 | 0 | LONG PULSE |
| 1 | 1 | TYPICALLY NOT USED |

When scan bits b6 and b7 are programmed to both be low, programmable delay circuit 1102 may be in a default state in which CMOS transmission gates 1116 and 1126 are off and resistors 1114 and 1124 provide a predetermined amount of delay to the signal on line 914 (along with inverters 1108, 1109, 1123, and 1130). For one embodiment, resistors 1114 and 1124 may each be from approximately 500 to 5000 ohms. For this embodiment, the amount of delay provided by programmable delay circuit 1102 to the signal on line 914 may approximately 1 nanosecond. This will cause a corresponding amount of delay in the clock pulse width of the signal on line 222. Other amounts of delay may be used.

For other embodiments, resistors 1114 and 1124 may be any values to provide a predetermined amount of delay when scan bits b6 and b7 are low. For other embodiments, other delay circuits may be used in place of resistors 1114 or 1124. For example, one or more inverters may be used.

When scan bit b7 is low and scan bit b6 is high, CMOS transmission gates 1132 and 1136 are enabled to couple capacitors 1134 and 1138 to nodes 1118 and 1128, respectively. This will increase the amount of delay provided by programmable delay circuit 1102 to the signal on line 914. For one embodiment, capacitors 1134 and 1138 each are approximately from 1 to 50 femtofarads. For this embodiment, the amount of delay provided by programmable delay circuit 1102 to the signal on line 914 is approximately from 100 to 600 picoseconds greater than the amount of delay provided in the default mode when scan bits b6 and b7 are low. For example, this amount of delay may be approximately 325 picoseconds greater than the amount of delay provided in the default mode when scan bits b6 and b7 are low. This correspondingly increases the pulse width of the signal on line 222 in FIG. 9 by approximately the same amount. For other embodiments, capacitors 1114 and 1124 may each be any value to provide a desired predetermined amount of additional delay to the signal on line 222.

When scan bit b7 is low and scan bit b6 is high, CMOS transmission gates 1116 and 1126 are enabled to couple a generally lower resistance electrical path around or bypassing resistors 1114 and 1124. Additionally, CMOS transmission gates 1132 and 1136 are deactivated, decoupling capacitors 1134 and 1138 from nodes 1118 and 1128, respectively. Thus, this configuration will decrease the amount of delay provided by programmable delay circuit 1102 to the signal on line 914. For one embodiment, the amount of delay provided by programmable delay circuit 1102 to the signal on line 914 is approximately from 100 to 600 picoseconds less than the amount of delay provided in the default mode when scan bits b6 and b7 are low. For example, this amount of delay may be approximately 500 picoseconds less than the amount of delay provided in the default mode when scan bits b6 and b7 are low. This subsequently decreases the pulse width of the signal on line 222 in FIG. 9 by approximately the same amount.

Finally, when scan bit b7 is high and scan bit b6 is high, CMOS transmission gates 1116 and 1126 are off, and CMOS transmission gates 1132 and 1136 are enabled such that capacitors 1134 and 1138 are coupled to nodes 1118 and 1128. This configuration will alter the of delay provided by programmable delay circuit 1102 to the signal on line 914 typically by an amount corresponding to the capacitance of capacitors 1134 and 1138.

A test clock pulse width on line 222 (e.g., CCPULSE) at which SRAM 200 functions properly or at an optimum speed may be determined by programming one or more of the states for scan bits 6 and 7 and monitoring the functionality or response of SRAM 200. Once the desired test clock pulse width is determined, the programmable storage elements 1150 and 1170 may be selectively blown or not blown to hard code or program the pulse width of the test clock on line 222.

For one embodiment, it may be determined that a desired test clock pulse width on line 222 is generated when scan bits b6 and b7 are low and high, respectively. A low state may be programmed as the output of inverter 1164 leaving fuse 1170 intact. A high may be programmed as the output of inverter 1154 by blowing fuse 1150. When SRAM 200 operates in the normal or default as indicated by state 1 of Table 1, signal 1106 selects inputs 1172 and 1174 at multiplexers 1156 and 1162, respectively, and the desired programmable delay from programmable delay circuit 1102 will be provided to the signal on line 914 to produce a desired pulse width for the signal on line 222. As is apparent, inverters 1152 and 1154, transistor 1148, and fuse 1150 (and/or the mirror circuit including elements 1164–1170) may be replaced by a programmed bit of nonvolatile memory should further testing be unnecessary, or with programmed RAM (static or dynamic) should retesting on start-up or reset be desirable and/or acceptable.

Fuses 1150 and 1170 may be blown by laser pulses or electrical signals. For other embodiments, fuses 1150 and 1170 may be other types of programmable devices includes flash memory cells, other nonvolatile memory cells, or other volatile memory cells (e.g., SRAM, DRAM, etc.) and the like.

While programmable delay circuit 1102 has been disclosed as providing a programmable delay for generating a variable clock pulse width for the signal on line 222 (e.g., CCPULSE), it may also be used to delay any signal internal or external to SRAM 200. Additionally, programmable delay circuit 600 of FIG. 6 may also be used in place of programmable delay circuit 1102 to generate the programmable delay in clock pulse generator 900.

Scan bit b5

Scan bit b5 may be used to programmably substitute or replace an internal signal of SRAM 200 with an external signal. For example, in clock pulse generator circuit 900 of FIG. 9, the signal on line 912 may be coupled to scan bit b5. When scan bit b5 is low, the clock pulse generator 900 functions as previously described. In contrast, when scan bit b5 is high on line 912, then the pulse width of the signal on line 222 is approximately the same as the pulse width of CLK. For this example, programmable delay circuit 902 may be decoupled from the circuit altogether.

Coupling scan bit b5 to line 912 may be particularly advantageous when the amount of programmable delay provided by programmable delay circuit 902 is insufficient to allow the signal on line 222 to achieve relatively long pulse durations (e.g., hundreds of nanoseconds or microseconds). Relatively long pulse durations may be desired when, for example, a word line stress test is performed on memory core 206 of SRAM 200.

A word line stress test may be implemented as follows. When address register 202 is enabled to output on the address to row decoder 204, row decoder 204 may only be enabled to drive an addressed word line in memory core 206 for as long as the clock pulse width (i.e., CCPULSE pulse width) is high on line 220. Usually, this is on the order to 1 to 10 nanoseconds for an SRAM functioning under typical or conventional conditions. However, it is often desirable to stress the operation of memory core 206 by enabling a word line to be selected for an extended period of time (e.g., hundreds of nanoseconds or microseconds). Driving a word line for an extended period of time causes selected memory cells in memory core 206 to continuously draw power and may provide more stress on the selected cells than when a shorter word line pulse duration is used. This may be useful during "burn-in" of SRAM 200, in which SRAM 200 is operated while placed in a chamber at an elevated temperature. During burn-in, the operation of defective or weak parts may be accelerated to the point of failure. Thus, the function of the burn-in test may be enhanced when bit 5 is enabled, thereby allowing an external clock signal to replace an internal clock signal when the external clock signal has a larger pulse width than that generated internally by clock pulse generator 900.

Operation Summary

Figure 12:
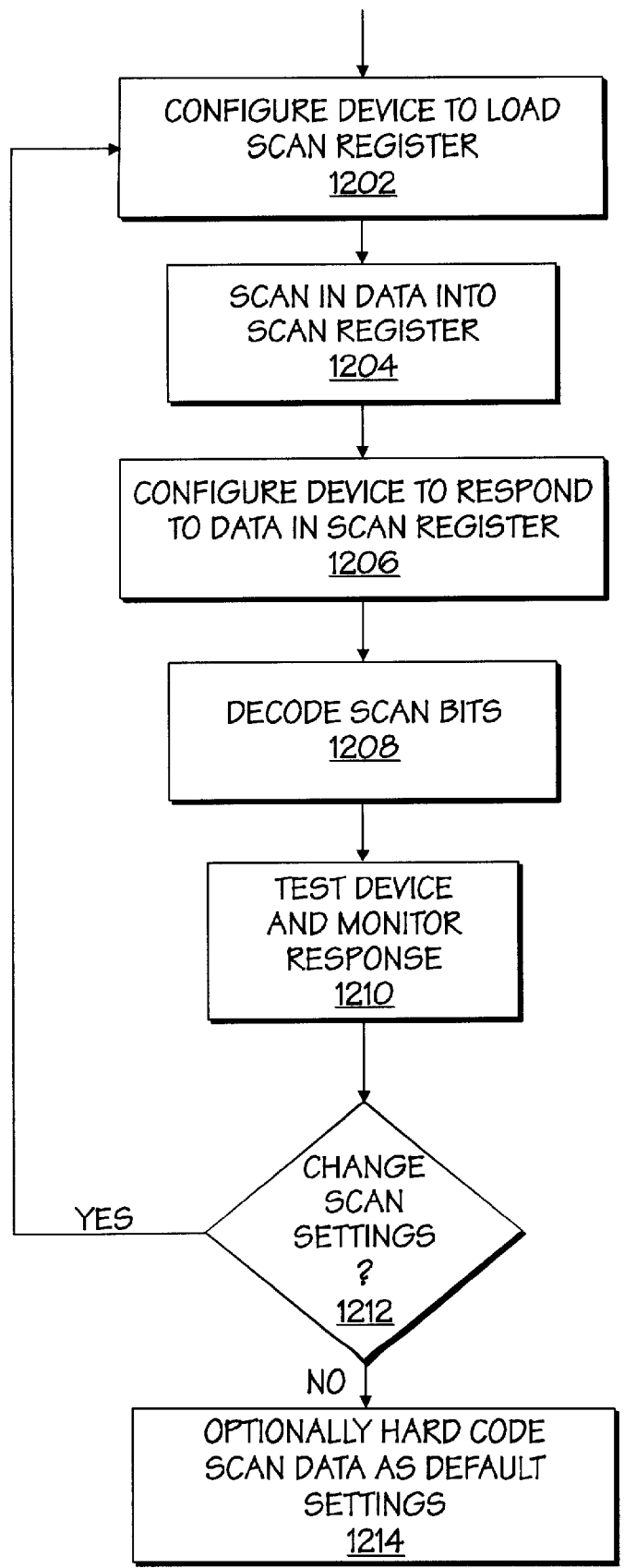
FIG. 12 shows one embodiment of a method of testing the SRAM device of FIG. 1.

FIG. 12 shows an exemplary protocol for using programmable scan interface 212 of FIG. 2 to program and test SRAM 200. At step 1202, the test mode signal is driven low and the scan enable signal is driven high to configure SRAM 200 to load scan bits or a test word into scan register 306. Thereafter (e.g., at step 1204), scan bits are loaded into scan register 306 (e.g., in response to SCLK). Subsequently, SE is driven low and TM is driven high to configure SRAM 200 in a test mode (e.g., step 1206).

In response to entering the test mode, the scan bits in scan register 306 are decoded by decode logic 304 to program a programmable delay circuit (e.g., step 1208). For example, in response to scan bits b1–b3, decode logic 504 may select one of the six delay paths of programmable delay circuit 600 to delay SACLK or another signal. For another example, in response to scan bits b6 and b7, decode logic 1104 may couple, decouple, or reconfigure resistors 1114 and 1124 and/or capacitors 1134 and 1138 of programmable delay circuit 1102 to programmably alter the pulse width of CCPULSE.

Alternatively at step 1208, scan bits may directly cause alterations in the function of SRAM 200 without necessarily decoding the scan bits. For example, scan bit b5 may directly configure clock pulse generator 900 to replace or substitute an external clock signal (e.g., CLK) for internally generated signed on line 222 (e.g., CCPULSE). For another example, bits 4 and 8 may directly switch the operation of one or more output registers between synchronous and asynchronous modes.

After the scan bits are decoded, the effect of the scan bits upon their respective circuits or timing signals may then be monitored by observing the operation of SRAM 200. For example, output register 218 may be placed in a flow through mode to observe the effect of the other scan bit functions on data output from memory core 206 through sense amplifiers 214. Alternatively, output register 218 may remain in a synchronous mode while observing the effects of the other scan bit functions on data output from memory core 206 through sense amplifiers 214. Monitored responses may be pass or fail conditions, or increases or decreases in the data output rate.

Based on the monitored response of the effects of the first scan bit settings, a user may decide to alter the scan bits at step 1212. If the user wants to alter the scan bits to load a new test word, then the process returns to step 1202. If the user does not want to alter the scan bits, then the process proceeds to step 1214. At step 1214, the user may hard code the scan bits settings as the default settings for SRAM 200. For example, a user may blow one or more of the fuses in decode logic 1104 to hard code the amount of a clock pulse width that results in a desired operation of SRAM 200. For other embodiments, other programmable elements may be included in other circuits disclosed herein to hard code the selected scan bit setting as the default timing or operation of circuits in SRAM 200.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:

an output register having a first stage receiving a register input, a second stage receiving an output from the first stage and providing a register output, a synchronous mode of operation and an asynchronous mode of operation;

a dedicated control circuit coupled to the output register to control whether the output register operates in the synchronous mode or the asynchronous mode; and a scan register having scan data, wherein the control circuit controls whether the register operates in the synchronous or asynchronous mode in response to the scan data.

2. The circuit of claim 1, wherein in the asynchronous mode of operation the data signal passes through both the first stage and the second stage.

3. A memory device comprising:

the circuit of claim 1;

a memory array storing data; and a sense amplifier coupled to the memory array and the output register, the sense amplifier sensing data stored in the memory array and outputting the sensed data to the output register.

4. The memory device of claim 3, wherein the memory device is a synchronous pipelined static random access memory (SRAM) device.

5. A circuit comprising:

an output register having a first stage receiving a register input, a second stage receiving an output from the first stage and providing a register output, a synchronous mode of operation and an asynchronous mode of operation; and a dedicated control circuit coupled to the output register to control whether the output register operates in the synchronous mode or the asynchronous mode, wherein the dedicated control circuit outputs a first clock signal and a second clock signal, wherein the first and second clock signals have complementary logic states when the output register operates in the synchronous mode, and wherein the first and second clock signals have the same logic state when the output register operates in the asynchronous mode.

6. The circuit of claim 5, wherein the dedicated control circuit comprises:

a first logic device generating an intermediate signal in response to scan data;

a second logic device generating the second clock signal in response to the intermediate signal and an input clock signal; and a third logic device generating the first clock signal in response to the second clock signal and the intermediate signal.

7. The circuit of claim 6, wherein the first, second, and third logic devices each comprise NOR gates.

8. The circuit of claim 5, wherein the first stage comprises:

a first transmission gate coupled to the first clock signal and receiving a data signal;

a first inverter having an input coupled to the first transmission gate, and an output.

9. The circuit of claim 8, wherein the second stage comprises:

a second transmission gate coupled to the second clock signal and the output of the first inverter; and a second inverter having an input coupled to the second transmission gate, and an output.

10. The circuit of claim 7, wherein the second stage further comprises a logic device for resetting the output of the second inverter in response to a reset signal.

11. The circuit of claim 5, wherein the control circuit comprises:

a first logic device generating the first clock signal in response to scan data and an input clock signal; and a second logic device generating the second clock signal in response to the scan data and the input clock signal.

12. The circuit of claim 5, further comprising a scan register having scan data, wherein the control circuit controls whether the register operates in the synchronous or asynchronous mode in response to the scan data.

13. A circuit comprising:

a register having a first stage and a second stage;

dedicated means for clocking data through the first stage and subsequently clocking the data through the second stage of the register;

dedicated means for asynchronously passing data through the first and second stages of the register; and a scan register having scan data for determining which of the dedicated means controls the register.

14. A circuit comprising:

a register having (i) a first stage receiving a register input, (ii) a second stage to receive an output from the first stage and provide a register output, (iii) a synchronous mode of operation and (iv) an asynchronous mode of operation;

a control circuit coupled to the register to control whether the register operates in the synchronous mode or the asynchronous mode, wherein the control circuit outputs a first clock signal and a second clock signal, wherein the first and second clock signals have complementary logic states when the register operates in the synchronous mode, and wherein the first and second clock signals have the same logic state when the register operates in the asynchronous mode; and an output buffer to receive the register output.

15. The circuit of claim 14, wherein the control circuit comprises:

a first logic device generating the second clock signal in response to the scan data and an input clock signal; and a second logic device generating the first clock signal in response to the scan data and the input clock signal.

16. The circuit of claim 14, wherein the control circuit comprises:

a first logic device generating an intermediate signal in response to the scan data;

a second logic device generating the second clock signal in response to the intermediate signal and an input clock signal; and a third logic device generating the first clock signal in response to the second clock signal and the intermediate signal.

17. The circuit of claim 14, wherein the second stage further comprises a logic device for resetting the output of the second stage in response to a reset signal.

18. A circuit comprising:

a register having (i) a first stage receiving a register input, (ii) a second stage to receive an output from the first stage and provide a register output, (iii) a synchronous mode of operation and (iv) an asynchronous mode of operation;

a control circuit coupled to the register to control whether the register operates in the synchronous mode or the asynchronous mode;

an output buffer to receive the register output; and a scan register having scan data, wherein the control circuit controls whether the register operates in the synchronous or asynchronous mode in response to the scan data.

19. The circuit of claim 18, wherein the control circuit outputs a first clock signal and a second clock signal, wherein the first and second clock signals have complementary logic states when the register operates in the synchronous mode, and wherein the first and second clock signals have the same logic state when the register operates in the asynchronous mode.

20. The circuit of claim 19, wherein the control circuit comprises:

a first logic device generating the second clock signal in response to the scan data and an input clock signal; and a second logic device generating the first clock signal in response to the scan data and the input clock signal.

21. The circuit of claim 19, wherein the control circuit comprises:

a first logic device generating an intermediate signal in response to the scan data;

a second logic device generating the second clock signal in response to the intermediate signal and an input clock signal; and a third logic device generating the first clock signal in response to the second clock signal and the intermediate signal.

22. The circuit of claim 18, wherein the second stage further comprises a logic device for resetting the output of the second stage in response to a reset signal.

* * * * *